(12) United States Patent
Kobashi et al.

(10) Patent No.: US 8,574,933 B2
(45) Date of Patent: Nov. 5, 2013

(54) FABRICATION METHOD OF SEMICONDUCTOR DEVICE

(71) Applicant: Renesas Electronics Corporation, Kawasaki (JP)

(72) Inventors: Hideharu Kobashi, Tokyo (JP); Hiroshi Maki, Tokyo (JP); Masayuki Mochizuki, Tokyo (JP); Yoshiaki Makita, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/738,473

(22) Filed: Jan. 10, 2013

(65) Prior Publication Data

US 2013/0122615 A1    May 16, 2013

Related U.S. Application Data

(60) Division of application No. 12/840,333, filed on Jul. 21, 2010, now Pat. No. 8,367,433, which is a division of application No. 12/436,647, filed on May 6, 2009, now Pat. No. 7,824,932, which is a continuation of application No. 11/850,503, filed on Sep. 5, 2007, now abandoned.

(30) Foreign Application Priority Data

Sep. 6, 2006    (JP) .................................. 2006-241559

(51) Int. Cl.
    *H01L 21/66* (2006.01)
(52) U.S. Cl.
    USPC ...................... 438/16; 438/7; 438/14; 438/15

(58) Field of Classification Search
    USPC .................................................. 438/7, 14–16
    See application file for complete search history.

(56) References Cited

U.S. PATENT DOCUMENTS

6,365,425 B1    4/2002    Ikota et al.
6,551,906 B2    4/2003    Oka
(Continued)

FOREIGN PATENT DOCUMENTS

JP    S59-099581 A    6/1984
JP    H5-343447 A    12/1993
(Continued)

OTHER PUBLICATIONS

Office Action issued Apr. 17, 2012, in Japanese Application No. 2006-241559.

(Continued)

*Primary Examiner* — Bac Au
(74) *Attorney, Agent, or Firm* — Miles & Stockbridge P.C.

(57) ABSTRACT

A technique is provided which can exactly recognize a chip to be picked up when picking up the chip from a wafer sheet in a process of die bonding a thin chip. A camera is coupled to one end of a lens barrel, an objective lens is attached to an opposite end of the lens barrel, and an image of a main surface of a chip is photographed through the objective lens. A surface-emitting lighting unit, a diffusing plate and a half mirror are internally provided between the lens barrel and the chip. Further, another lens barrel having a coaxial drop lighting function of radiating light to the main surface of the chip along the same optical axis as that of the camera is disposed.

13 Claims, 50 Drawing Sheets

(56) References Cited

U.S. PATENT DOCUMENTS

| | | |
|---|---|---|
| 7,031,791 B1 | 4/2006 | Chang |
| 7,045,387 B1 | 5/2006 | Chang et al. |
| 7,391,036 B2 * | 6/2008 | Hatakeyama et al. ..... 250/492.2 |
| 2002/0106820 A1 * | 8/2002 | Nikawa ............................ 438/14 |
| 2003/0224540 A1 * | 12/2003 | Watanabe et al. .................. 438/7 |
| 2004/0075837 A1 | 4/2004 | Maeda et al. |
| 2004/0126909 A1 * | 7/2004 | Obara et al. .................... 438/14 |
| 2004/0225222 A1 | 11/2004 | Zeng et al. |
| 2006/0030060 A1 * | 2/2006 | Noguchi et al. ................ 438/14 |
| 2006/0166466 A1 | 7/2006 | Maki et al. |
| 2006/0250609 A1 | 11/2006 | Meeks et al. |
| 2007/0284759 A1 | 12/2007 | Suguro et al. |
| 2008/0265159 A1 | 10/2008 | Hatakeyama et al. |
| 2008/0280382 A1 | 11/2008 | Lu et al. |

FOREIGN PATENT DOCUMENTS

| | | |
|---|---|---|
| JP | H7-190726 A | 7/1995 |
| JP | 9-282442 A | 10/1997 |
| JP | 11-345865 A | 12/1999 |
| JP | 2000-127080 A | 5/2000 |
| JP | 2001-127080 A | 5/2001 |
| JP | 2002-76031 A | 3/2002 |
| JP | 2002-289628 A | 10/2002 |
| JP | 2005-32827 A | 2/2005 |
| JP | 2006-041090 A | 2/2006 |
| JP | 2006-80176 A | 3/2006 |

OTHER PUBLICATIONS

Office Action issued Jul. 2, 2013, in Japanese Patent Application No. 2012-133686.

* cited by examiner

FABRICATION METHOD OF SEMICONDUCTOR DEVICE

CROSS-REFERENCE TO RELATED APPLICATIONS

The disclosure of Japanese Patent Application No. 2006-241559 filed on Sep. 6, 2006 including the specification, drawings and abstract is incorporated herein by reference in its entirety.

BACKGROUND OF THE INVENTION

The present invention relates to a semiconductor device manufacturing technique and more particularly to a technique applicable effectively to a semiconductor chip pickup process using a die bonder.

In Japanese patent laid-open No. 2000-127080, there is disclosed a bonder having a lighting device using LED which permits easy outline recognition and pattern matching in imagewise recognizing a semiconductor pellet and which is high in accuracy.

In Japanese patent laid-open No. Hei 11 (1999)-345865, there is disclosed a technique for recognizing a semiconductor chip in a process of picking up a semiconductor chip from a wafer sheet, which technique makes lighting from the side (back side of the semiconductor chip) opposite to a CCD camera to improve the chip recognizing rate.

In Japanese patent laid-open No. 2005-32827, there is disclosed a technique for acquiring an entire wafer image with use of a camera, then recognizing a semiconductor chip dropped-out portion and picking up semiconductor chips while skipping the defective area.

In Japanese patent laid-open No. Hei 9 (1997)-282442, there is disclosed a technique wherein an object to be recognized is lit with continuous pulse light of a high frequency emitted from a light source, the luminance in a specific area of a camera screen is integrated by one screen, then cumulative light quantity is measured and adjusted into optimal cumulative light quantity, and at the time of strobe lighting with one-shot light there is made adjustment so that the cumulative light quantity of luminance in the aforesaid specific area becomes equal to the optimal cumulative light quantity using continuous pulse light, thereby picking up an image of the to-be-recognized object in an optimum condition.

In Japanese patent laid-open No. 2002-76031, wherein, when a semiconductor chip supported by a support member is lit from its back side to pick up an image thereof in a state of a shadow picture, light emitted from a light source is radiated to the semiconductor chip efficiently.

In Japanese patent laid-open No. 2002-289628, there is disclosed a technique wherein, for plural objects held spacedly by a holding member, light is passed through the spacings from the side opposite to an image recognizing side to recognize those objects imagewise, thus permitting image recognition with a high accuracy.

In Japanese patent laid-open No. 2006-80176, there is disclosed a method for recognizing an electronic part with use of a camera and picking it up, wherein the camera is fixed and only lighting is approximated to the electronic part, thereby making it possible to recognize the position of the electronic part accurately.

SUMMARY OF THE INVENTION

Recently, with a view to attaining high density packaging of a semiconductor device, a package with plural semiconductor chips (hereinafter referred to simply as chips) stacked on a wiring substrate has been used practically. In assembling such a package, there are used chips each machined as thin as several ten μm or so in thickness.

In a chip die bonding process, when picking up a chip from a wafer sheet which holds chips, light is radiated by a coaxial spot lighting unit or a ring lighting unit to the chips held along the wafer outline while adjusting the quantity of the light, whereby a chip pickup work is carried out while recognizing picked-up chips and defective chips. However, in the case of such a thin chip as above, a stress is induced due to for example a difference in thermal expansion coefficient between a substrate such as a silicon substrate and a thin film deposited on the substrate and there may occur a deformation, e.g., deflection, of the chip. If light is radiated to such a deformed chip by the above method using a coaxial spot lighting unit or a ring lighting unit, the light is not uniformly radiated to the chip. As a result, on the chip recognizing side, it is impossible to obtain a clear chip image and at the chip-acquired position it is impossible to judge whether the chip has already been picked up or is a defective chip.

It is an object of the present invention to provide a technique able to recognize a to-be-picked-up chip correctly at the time of picking up the chip from a wafer sheet in a thin chip die bonding process.

The following is a brief description of typical modes of the present invention as disclosed herein.

1. A fabrication method of a semiconductor device, comprising the steps of:

(a) providing a semiconductor wafer having a main surface and a back surface, the main surface being partitioned into a plurality of chip areas by dividing areas, with an integrated circuit being formed in each of the chip areas, the back surface having a pressure-sensitive adhesive tape affixed thereto;

(b) cutting the semiconductor wafer along the dividing areas into a plurality of semiconductor chips and holding the semiconductor chips with the pressure-sensitive adhesive tape;

(c) radiating first irradiation light emitted from a first light source, from above, to an upper surface of a first semiconductor chip to be peeled off from the pressure-sensitive adhesive tape out of the plural semiconductor chips held with the pressure-sensitive adhesive tape, receiving first reflected light from the upper surface of the first semiconductor chip by image pickup means, and acquiring a first image of the upper surface of the first semiconductor chip;

(d) on the basis of the first image acquired in the step (c), determining whether the first semiconductor chip is present or not and whether the first semiconductor chip is good or bad, and if the first semiconductor chip is determined to be present as a good chip on the basis of the first image, chucking and holding the upper surface of the first semiconductor chip by a chucking collet and thereby peeling off the semiconductor chip from the pressure-sensitive adhesive tape; and (e) after the step (d), die-bonding a lower surface of the first semiconductor chip to a chip mounting area while chucking and holding the upper surface of the first semiconductor chip by the chucking collet.

The first light source is formed by a first surface-emitting light source, the first surface-emitting light source being disposed within a lens barrel and adapted to emit light uniformly from a light emitting surface. A first diffusing plate for diffusing the first irradiation light emitted from the first light source is disposed within the lens barrel. The first irradiation light passes through the diffusing plate and is then radiated to the upper surface of the first semiconductor chip. The first irradiation light and the first reflected light advance through the interior of the lens barrel.

2. A fabrication method of a semiconductor device, comprising the steps of:
(a) providing a semiconductor wafer having a main surface and a back surface, the main surface being partitioned into a plurality of chip areas by dividing areas, with an integrated circuit being formed in each of the chip areas, the back surface having a pressure-sensitive adhesive tape affixed thereto;
(b) cutting the semiconductor wafer along the dividing areas into a plurality of semiconductor chips and holding the semiconductor chips with the pressure-sensitive adhesive tape;
(c) radiating first irradiation light emitted from a first light source, from above, to an upper surface of a first semiconductor chip to be peeled off from the pressure-sensitive adhesive tape out of the plural semiconductor chips held with the pressure-sensitive adhesive tape, radiating second irradiation light to the upper surface of the first semiconductor chip from two second light sources disposed so as to sandwich the first semiconductor chip therebetween in plan, receiving first reflected light from the upper surface of the semiconductor chip by image pickup means, and acquiring a first image of the upper surface of the first semiconductor chip;
(d) on the basis of the first image acquired in the step (c), determining whether the first semiconductor chip is present or not and whether the first semiconductor chip is good or bad, and if the first semiconductor chip is determined to be present as a good chip on the basis of the first image, chucking and holding the upper surface of the first semiconductor chip by a chucking collet and thereby peeling off the first semiconductor chip from the pressure-sensitive adhesive tape; and
(e) after the step (d), die-bonding a lower surface of the first semiconductor chip to a chip mounting area while chucking and holding the upper surface of the first semiconductor chip by the chucking collet.

The angle of incidence of the second irradiation light on the upper surface of the first semiconductor chip is 10° to 60°.

The following is a brief description of effects obtained by the typical modes of the present invention as disclosed herein. (1) At the time of peeling off a semiconductor chip held by a pressure-sensitive adhesive tape such as a dicing tape from the pressure-sensitive adhesive tape and picking it up, irradiation light emitted from a surface emitting light unit is passed through a diffusing plate, then is radiated to a main surface of the chip to be picked up, and reflected light is received by image pickup means to acquire an image of the main surface of the chip to be picked up. Consequently, it is possible to obtain a clear image. (2) At the time of peeling off a semiconductor chip held by a pressure-sensitive adhesive tape such as a dicing tape and picking it up, light is emitted at a low angle to a main surface of the chip to be picked up and reflected light is received by image pickup means to acquire an image of the chip main surface. Consequently, it is possible to obtain a clear image. (3) At the time of peeling off a semiconductor chip held by a pressure-sensitive adhesive tape such as a dicing tape and picking it up, four light sources are disposed so as to confront the four sides respectively of the to-be-picked-up chip in plan, irradiation light is emitted at a low angle to a main surface of the to-be-picked-up chip from a selected one of the four light sources, and reflected light is received by image pickup means to acquire an image of the chip main surface. Consequently, even in the case where there are few pattern features of the chip main surface, the feature can be made conspicuous and extracted.

DETAILED DESCRIPTION OF PREFERRED EMBODIMENTS

Figure 1:
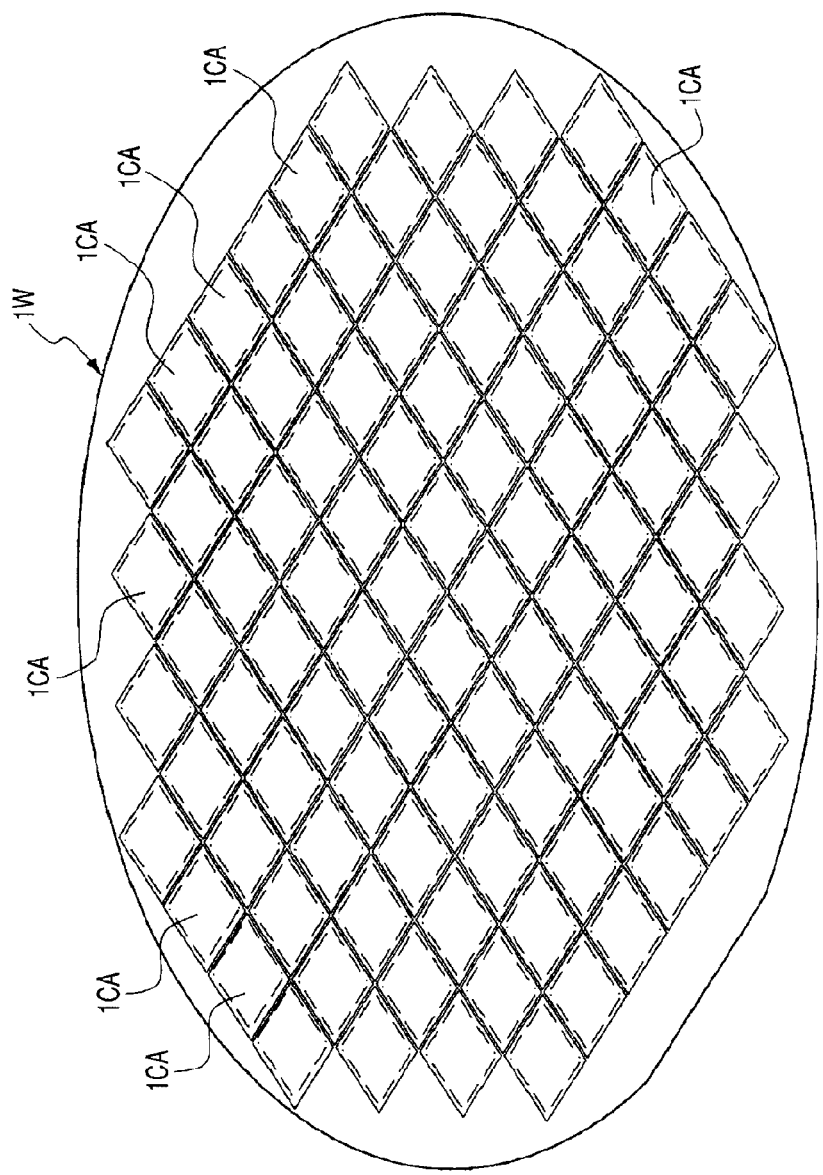
FIG. 1 is a perspective view of semiconductor chips used in manufacturing a semiconductor device according to a first embodiment of the present invention.

Before describing the present invention in detail, the meanings of terms as used herein will be described below.

By "wafer" is meant a single crystal silicon substrate (generally circular in plan) used in the manufacture of a semiconductor element or an integrated circuit, SOI (Silicon On Insulator) substrate, epitaxial substrate, sapphire substrate, glass substrate, any other insulating, semi-insulating or semiconductor substrate, or a composite substrate thereof. By "semiconductor device" is meant to include not only those fabricated on a semiconductor or insulator substrate such as silicon wafer or sapphire substrate but also those fabricated on other insulating substrates such as glass, e.g., TFT (Thin Film Transistor) and STN (Super-Twisted-Nematic) liquid crystals, unless otherwise mentioned.

By "device surface" or "element-forming surface" is meant a main surface of a wafer on which device patterns corresponding to plural chip areas are formed by lithography.

By "contrast" is meant a contrast of white and black expressed in a screen. In what state it appears is designated tone. By "high contrast" it is meant that the light-shade or deep-thin difference is clear, also designated clearness.

By "directional characteristic" is meant direction dependence of LED brightness intensity represented in terms of a relative value. The angle at which the brightness intensity is 50% of a peak value is designateda directional angle half-value width, serving as a guideline for the sharpness of directional characteristic.

By "specular reflection" it is meant that light is radiated to a mirror-like work surface, then is reflected as it is and forms an image. The light is designated specular reflection light.

By "scattered light" is meant light whose traveling direction has been changed by collision or interaction with an object. For example, light radiated to pure-white paper scatters in various directions, so that an image is not formed on the paper nor does the paper become transparent like glass to permit an object present on the opposite side of the paper to be seen through. However, the light is scattered and both surface and back of the paper look bright. This is scattered light, which is also designated scattered reflected light or scattered transmitted light.

By "parallel light" is meant light which travels in parallel unlimitedly without expansion of light rays. The sunlight radiated to the earth from over the universe is extremely close to parallel light. The parallel light is small in variations in the irradiation angle relative to an object.

By "illuminance" is meant the quantity of light which a certain surface receives from a light source. It is given in terms of a luminous flux incident per unit area. As the unit of illuminance there is used lx (lux). Illuminance (lx)=luminous flux (1 m: lumen)/area (m$^2$).

By "luminance" is meant brightness of a light source in a certain direction. The illuminance represents the brightness of an object irradiated with light, while the luminance has nothing to do with distance no matter how long the distance may be and the unit thereof is cd (candela)/m$^2$.

By "coaxial drop lighting" or "coaxial lighting" is meant radiating light to an object using a half mirror and using the same optical axis as that of a camera. An image is formed by specular reflection (perpendicular return reflection upon application of light in parallel with an optical axis of a lens).

By "diffusing filter" or "diffusing plate" is meant a filter or plate-like jig of such a color as milk-white used for diffusing light emitted from a light source to diminish unevenness in lighting.

By "ring lighting" is meant lighting in which light is radiated in a ring shape obliquely from above.

By "coaxial spot lighting" is meant coaxial lighting of a high luminance capable of lighting a small area brightly.

By "surface-emitting lighting" is meant uniform lighting from a light emitting surface. This lighting is based on a structure wherein radiated light is made uniform by a thin flat lighting unit with chip LEDs surface-mounted thereon or by the diffusing plate.

By "lens barrel" is meant a molded cylinder with an objective lens, etc. attached thereto. The lens barrel has a structure for preventing the entry light from any other place than predetermined places and for preventing the reflection of light on an inner surface.

By "collet" is meant a chucking/holding unit to be used for the conveyance of chips one by one after division of a wafer into individual chips by dicing for example.

By "sticking up a chip" is meant sticking up a chip with a needle-like pin or the like from the back side through a pressure-sensitive adhesive tape affixed to the back side of a wafer at the time of dividing the wafer into individual chips and thereafter chucking and conveying the thus-divided chips each individually.

Where required for convenience' sake, the following embodiments will each be described in a divided manner into plural sections or embodiments, but unless otherwise mentioned, they are not unrelated to each other but are in a relation such that one is a modification or a detailed or supplementary explanation of part or the whole of the other.

In the following embodiments, when reference is made to the number of elements (including the number, numerical value, quantity and range), no limitation is made to the number referred to, but numerals above and below the number referred to will do as well unless otherwise mentioned and except the case where it is basically evident that limitation is made to the number referred to.

It goes without saying that in the following embodiments their constituent elements (including constituent steps) are not always essential unless otherwise mentioned and except the case where they are considered essential basically obviously. Likewise, it goes without saying that in the following embodiments, "comprising A" when described in connection with a constituent element or the like does not exclude other elements except the case where it is described clearly that limitation is made to only the element referred to.

Likewise, it is to be understood when reference is made to the shapes and a positional relation of constituent elements in the following embodiments, those substantially closely similar to or resembling such shapes, etc. are also included unless otherwise mentioned and except the case where a negative answer is evident basically. This is also true of the foregoing numerical value and range.

When reference is made to the material or the like, the material specified is a principal material and does not exclude secondary elements, additives and additional elements unless otherwise mentioned and except the case where a negative answer is evident basically or in view of the situation. For example, unless otherwise mentioned, silicon material includes not only pure silicon but also added impurities and binary and ternary alloys (e.g., SiGe) containing silicon as a principal element.

In all of the drawings for illustrating the embodiments, portions having the same functions are identified by the same reference numerals, and repeated explanations thereof will be omitted in principle.

In the drawings used in the embodiments, even a plan view may be partially hatched to make it easier to see.

Embodiments of the present invention will be described in detail hereinunder with reference to the accompanying drawings.

First Embodiment

In this first embodiment the present invention is applied to the manufacture of a semiconductor package with chips mounted on a wiring substrate. A method of manufacturing the semiconductor package will be described process by process with reference to FIGS. 1 to 32.

First, integrated circuits are formed on a main surface of a wafer 1W constituted by a single crystal silicon as shown in FIG. 1. The integrated circuits are formed respectively in plural chip-forming areas (chip areas) 1CA which are partitioned by lattice-like scribing lines (dividing areas). Thereafter, the integrated circuits are subjected to an electric test to determine whether they are good or bad.

Figure 2:
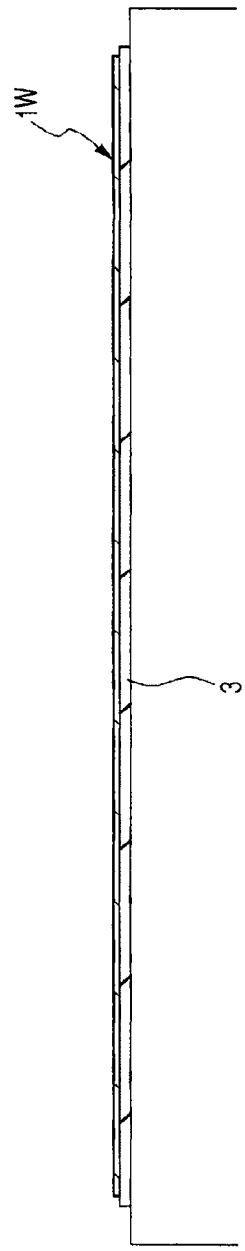
FIG. 2 is a side view showing a grinding process for a semiconductor wafer.

Next, as shown in FIG. 2, a back grinding tape 3 for protecting the integrated circuits is affixed to the integrated circuit-forming surface (a lower surface side in the figure) of the wafer 1W. In this state, a back surface (an upper surface side in the figure) of the wafer 1W is subjected to grinding with a grinder. Then, the thus-damaged layer on the back surface is removed by a suitable method such as, for example, wet etching, dry polishing or plasma etching, thereby thinning the wafer 1W to a thickness of not larger than 100 μm, e.g., about 20 to 90 μm. The above method such as wet etching, dry polishing or plasma etching is lower in its treating speed in the wafer thickness direction than the grinding speed using a grinder, but is advantageous in that not only the damage to the interior of the wafer is less than that in the grinding with a grinder, but also the damaged layer in the interior of the wafer resulting from the grinding with a grinder can be removed, whereby the wafer 1W and chips become difficult to be cracked.

Figure 3:
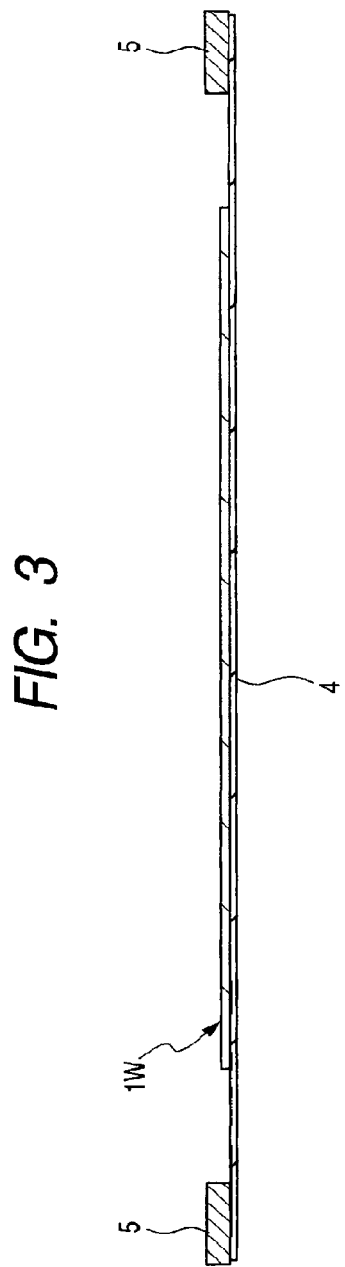
FIG. 3 is a side view showing a process of affixing a dicing tape to the semiconductor wafer.

Next, the back grinding tape 3 is removed. Thereafter, as shown in FIG. 3, a DAF (Die Attach Film (not shown)) serving as an adhesive at the time of mounting chips to a wiring substrate is affixed to the back surface (the surface opposite to the integrated circuit-forming surface) of the wafer 1W, further, a dicing tape (a pressure-sensitive adhesive tape) 4 having a thickness of about 60 to 120 μm is affixed onto the DAF, and in this state the peripheral portion of the dicing tape 4 is fixed to a wafer ring 5. There also is often adopted a method wherein the wafer 1W is affixed to the dicing tape 4 with DAF affixed thereto beforehand. The dicing tape 4 is formed by applying a pressure-sensitive adhesive to the surface of a tape base formed of, for example, polyolefin (PO (transparent or translucent)), polyvinyl chloride (PVC (transparent or translucent)) or polyethylene terephthalate (PET (transparent or translucent)) and cutting the tape base into a circular shape having tackness. A UV curing type or acrylic pressure-sensitive adhesive is also often employed.

Figure 4:
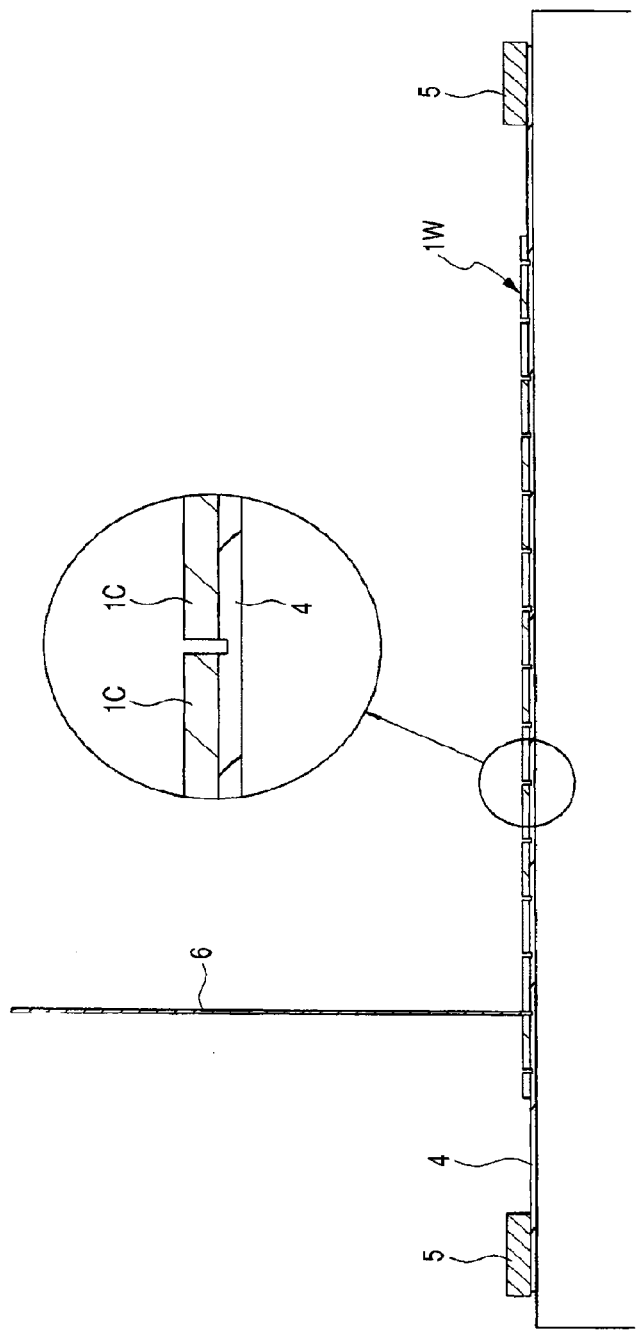
FIG. 4 is a side view showing a dicing process for the semiconductor wafer.

Next, as shown in FIG. 4, the wafer 1W is diced using a dicing blade 6 to divide the chip-forming areas 1CA into individual chips 1C of a square shape. At this time, it is necessary that the divided individual chips 1C be left on the dicing tape 4, and therefore the dicing tape 4 is cut in only several ten μm in its thickness direction. In case of using a UV curing type pressure-sensitive adhesive tape as the dicing tape 4, ultraviolet light is radiated to the dicing tape to decrease the tackness of the pressure-sensitive adhesive prior to a chip 1C peeling process which will be described later.

Figure 5:
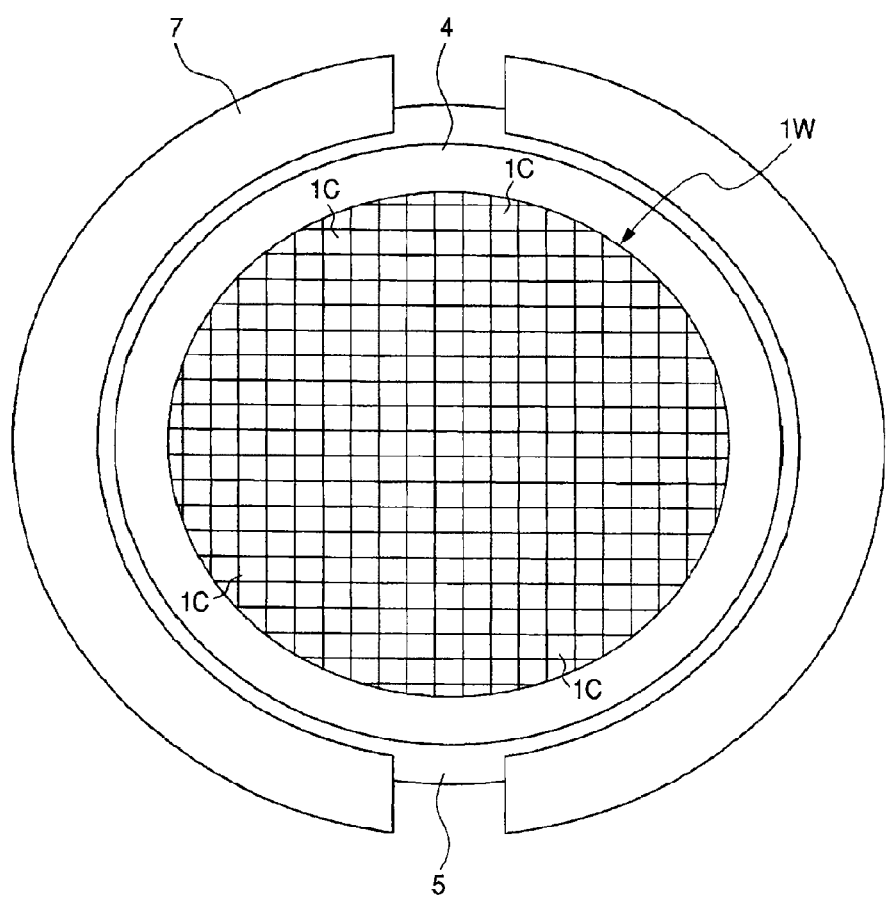
FIG. 5 is a plan view showing a state in which the semiconductor wafer and the dicing tape are fixed to a wafer ring, presser plates are disposed thereover, and an expanding ring is disposed thereunder.
Figure 6:
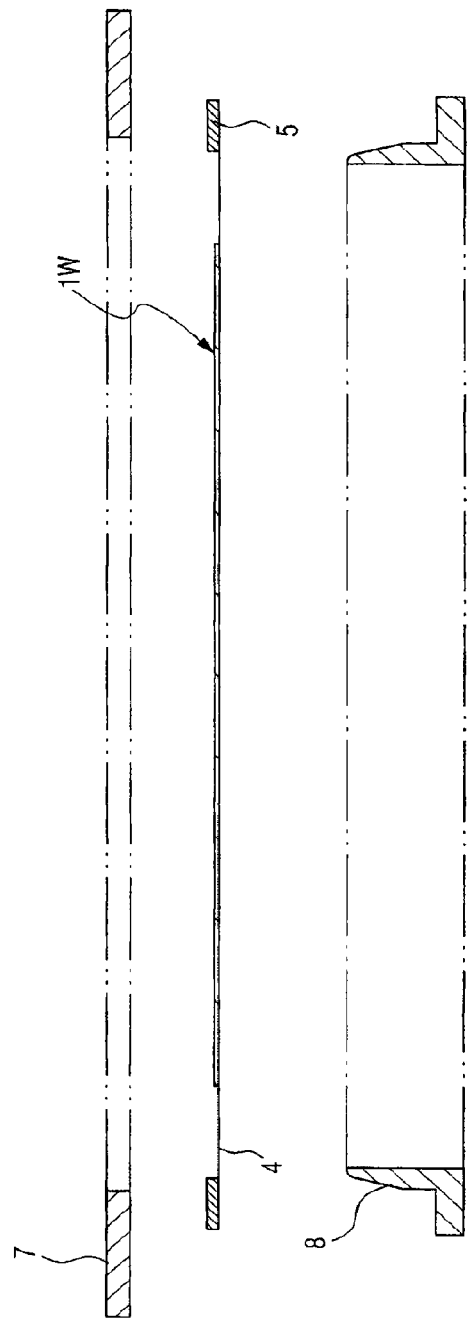
FIG. 6 is a sectional view showing a state in which the semiconductor wafer and the dicing tape are fixed to a wafer ring, presser plates are disposed thereover, and an expanding ring is disposed thereunder.
Figure 7:
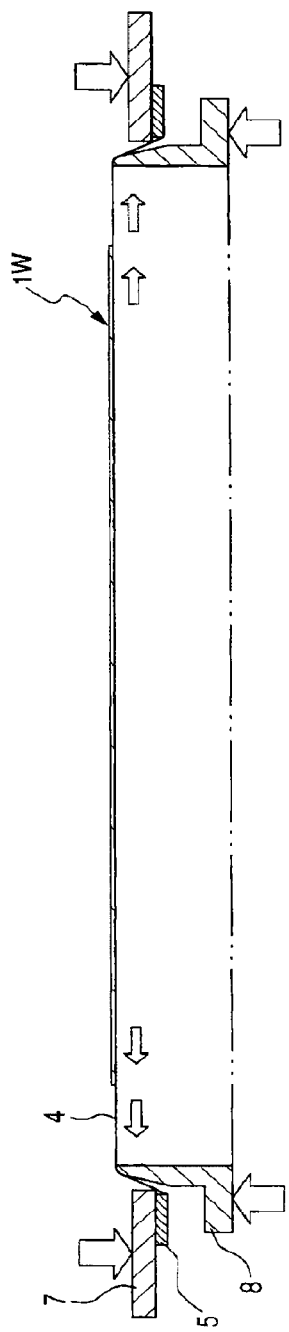
FIG. 7 is a sectional view showing a state in which tension of the dicing tape is created by sandwiching the dicing tape and the wafer ring by both presser plates and expanding ring.

Next, as shown in FIG. 5 (plan view) and FIG. 6 (sectional view), presser plates 7 are disposed over the dicing tape 4 fixed to the wafer ring 5 and an expanding ring 8 is disposed thereunder. Then, as shown in FIG. 7, the presser plates 7 are pushed against an upper surface of the wafer ring 5 and at the same time the peripheral portion of a back surface of the dicing tape 4 is pushed up by the expanding ring 8. As a result, the dicing tape 4 undergoes a strong tension acting from the central portion of the tape toward the peripheral portion and is thereby stretched without looseness in the horizontal direction.

Figure 8:
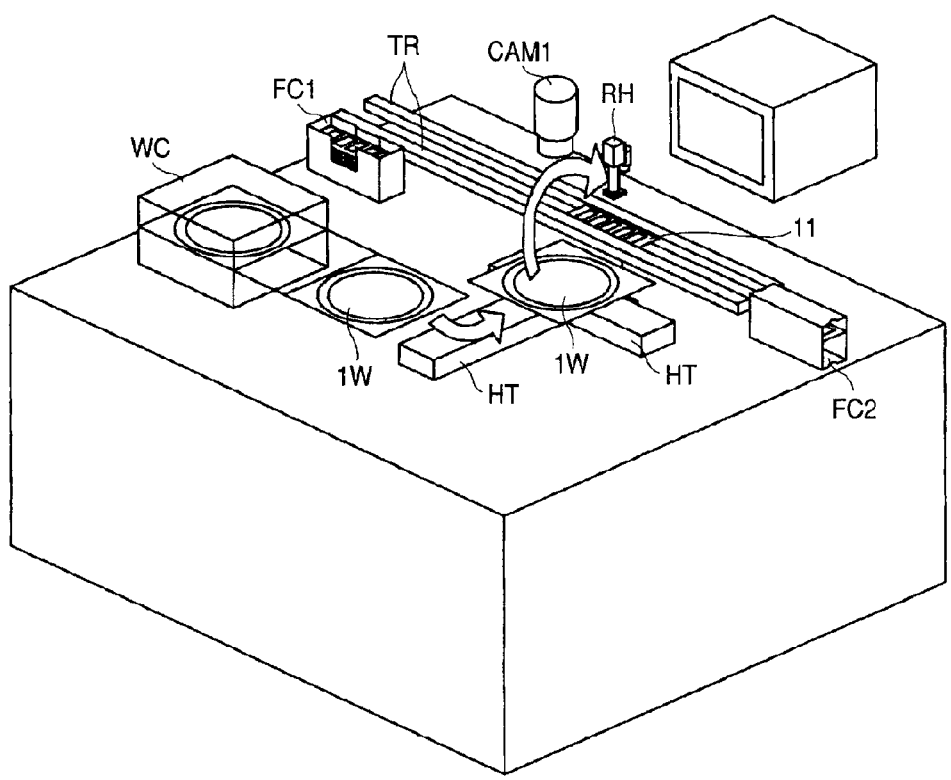
FIG. 8 is an explanatory diagram of a die bonder used in manufacturing the semiconductor device according to the first embodiment.
Figure 9:
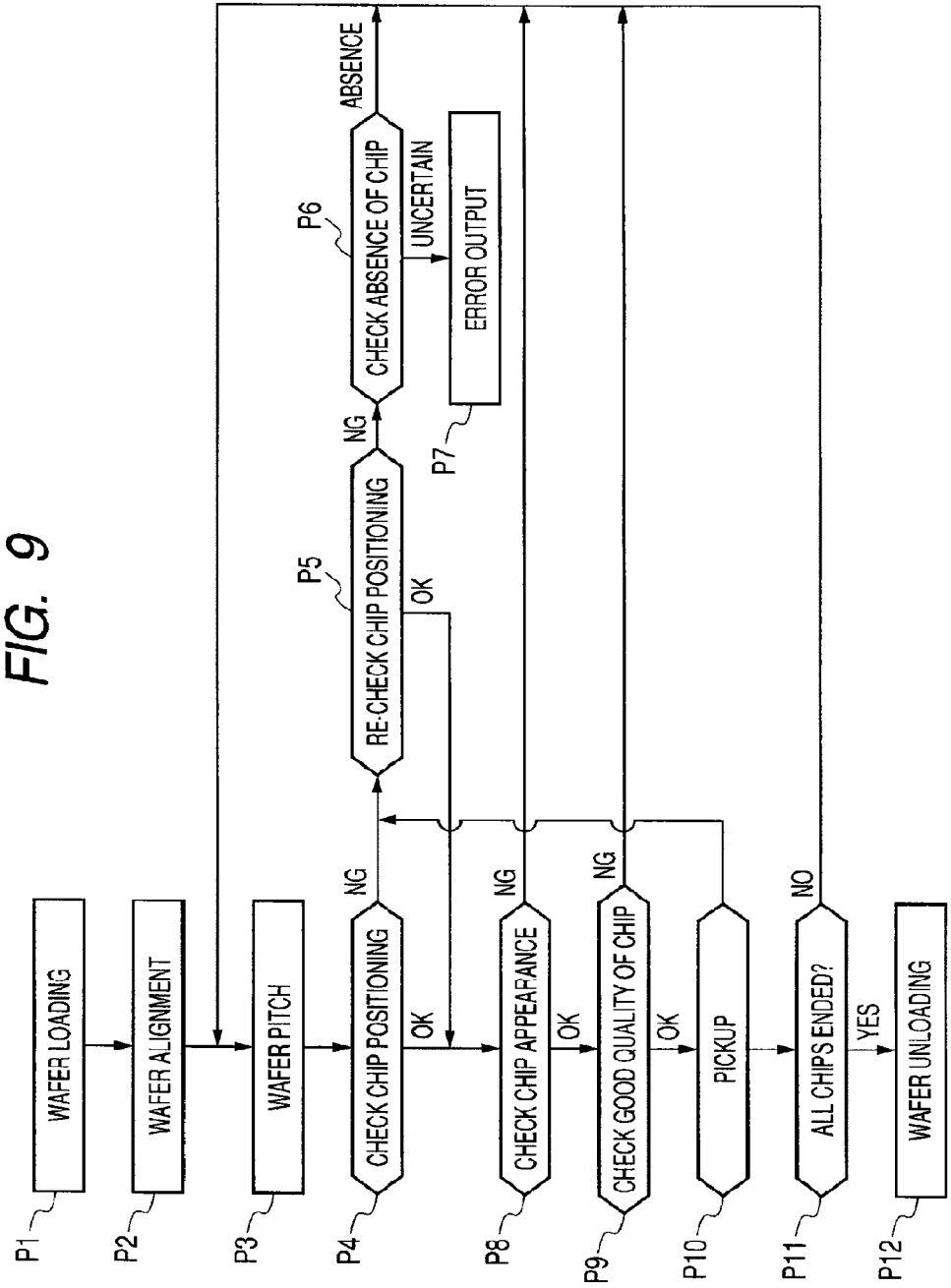
FIG. 9 is a flow chart showing the details of a die bonding process in the manufacture of the semiconductor device according to the first embodiment.

Then, there is performed die bonding of the individual chips 1C onto a wiring substrate. FIG. 8 is an explanatory diagram of a die bonder for the die bonding and FIG. 9 is a flow chart explaining the details (steps P1 to P12) of a die bonding process in this first embodiment.

As shown in FIG. 8, the wafer 1W divided into individual chips 1C is accommodated for example in a wafer cassette WC and is conveyed and set to the die bonder used in this first embodiment. The wafer 1W is then taken out from the wafer cassette WC and is placed on an XY table HT. The XY table HT is adapted to move horizontally to make adjustment so that a chip 1C picked up by a bonding head BH which includes a chucking collet is disposed at a predetermined position. Wiring substrates 11 are set to the die bonder in an accommodated state within a substrate cassette FC1 and are taken out one by one from the substrate cassette FC1. Each wiring substrate 11 thus taken out from the substrate cassette is conveyed along conveying rails TR to a predetermined position for die bonding of the chip 1C thereto. After completion of the die bonding of the chip 1C, the wiring substrate 11 is received into a substrate cassette FC2.

Figure 10:
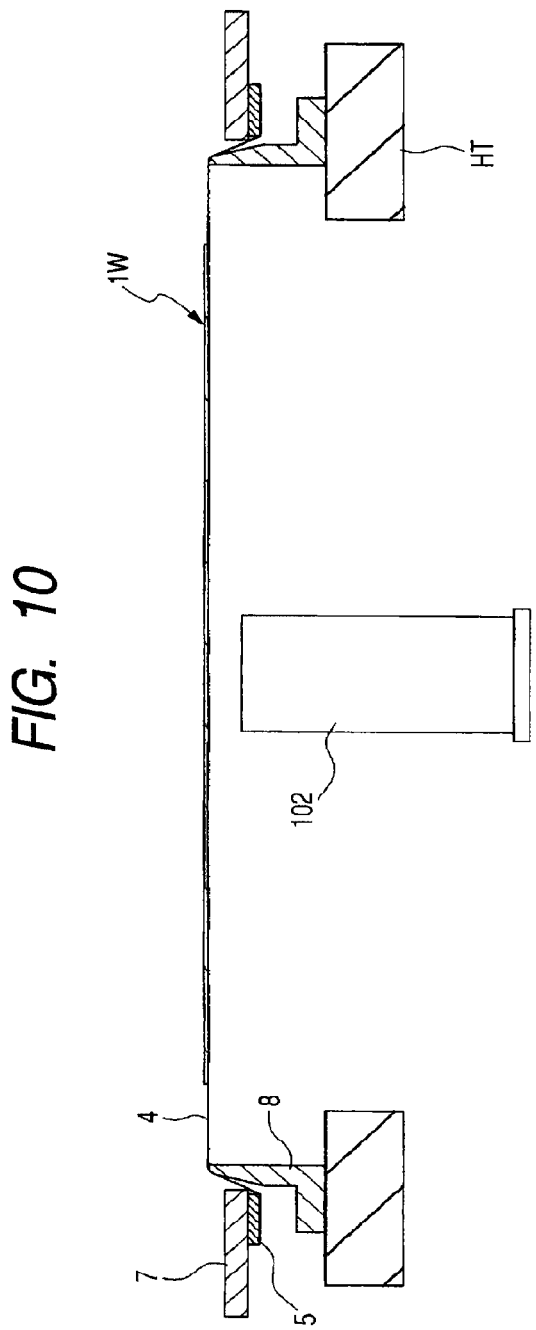
FIG. 10 is a sectional view of a principal portion illustrating a method for peeling off a semiconductor chip with the dicing tape affixed thereto.

As shown in FIG. 10, a chucking unit 102 adapted to be moved in both horizontal and vertical directions by a drive mechanism (not shown) is disposed centrally of the XY stage HT on which the wafer 1W is placed. The dicing tape 4 is held so that its back surface confronts an upper surface of the chucking unit 102. In this first embodiment the chip 1C is peeled off from the dicing tape 4 while chucking the back surface of the dicing table 4 with use of the chucking unit 102.

Figure 11:
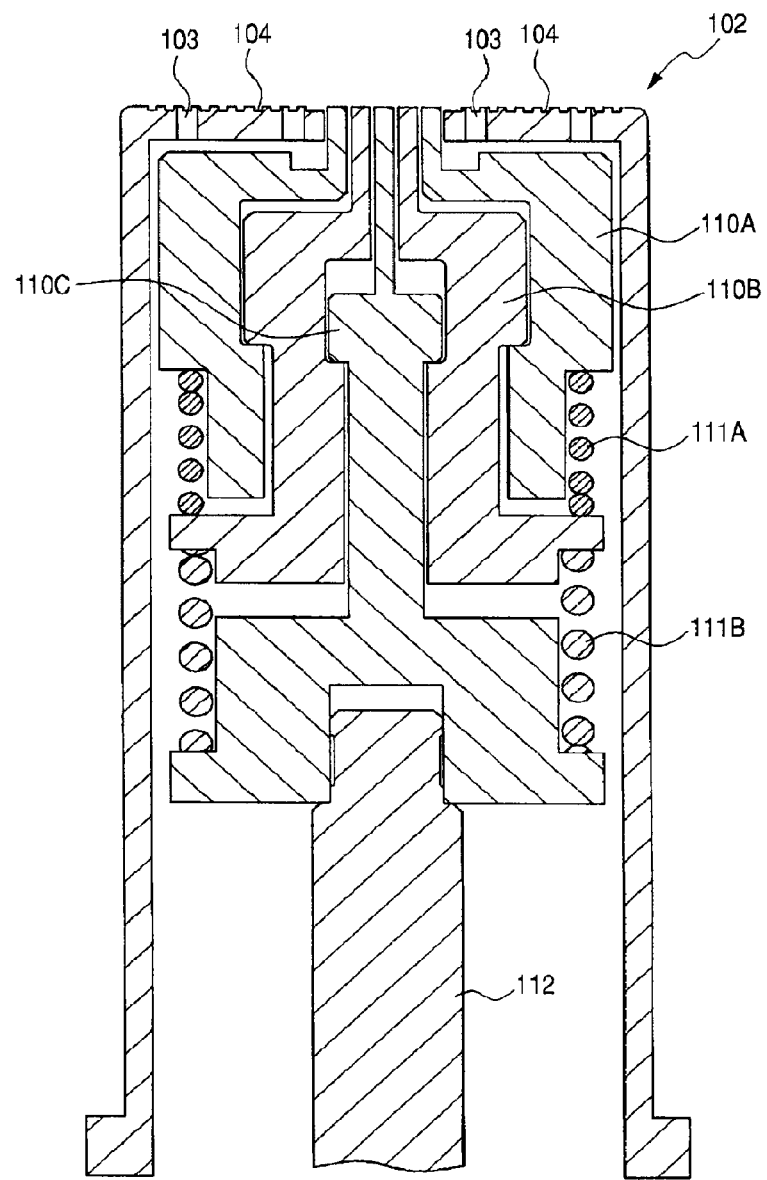
FIG. 11 is a sectional view showing a chucking unit provided on an XY stage.
Figure 12:
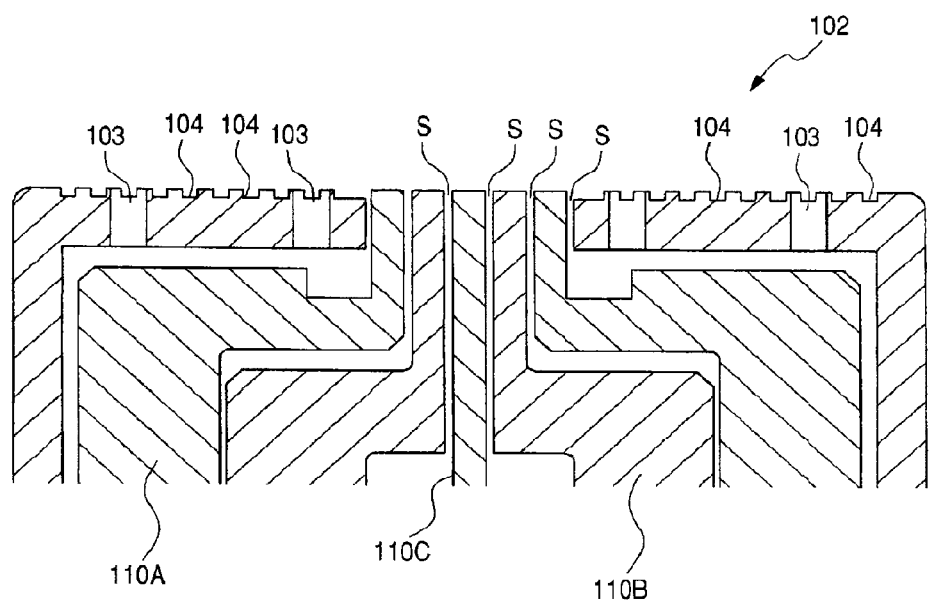
FIG. 12 is an enlarged sectional view of an upper surface of the chucking unit and the vicinity thereof.
Figure 13:
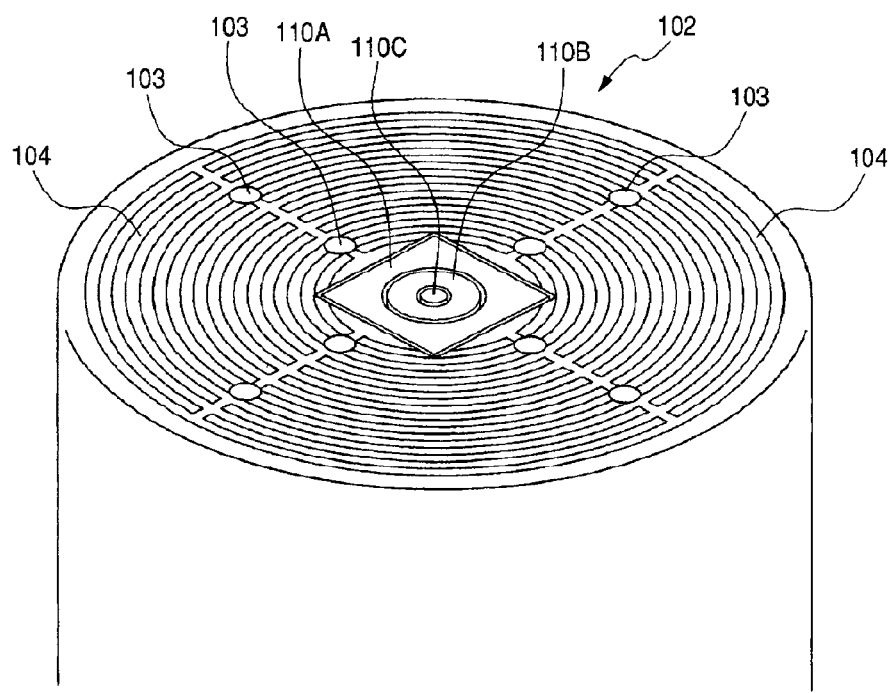
FIG. 13 is an enlarged perspective view thereof.

FIG. 11 is a sectional view of the chucking unit 102, FIG. 12 is an enlarged sectional view of the upper surface of the chucking unit 102 and the vicinity thereof, and FIG. 13 is an enlarged perspective view of the upper surface of the chucking unit 102 and the vicinity thereof.

In the peripheral portion of the upper surface of the chucking unit 102 there are formed plural suction ports 103 and plural grooves 104 formed in a concentric shape. The suction ports 103 may be formed in a larger number throughout the whole without forming the grooves 104. The interior of each of the suction ports 103 and the grooves 104 is pressure-reduced with a suction force of −90 to −60 kPa by a suction mechanism (not shown). At this time, the back surface of the dicing tape 4 is sucked downward into close contact with the upper surface of the chucking unit 102.

When sucking the dicing tape 4 downward, if the width and depth of each of the grooves 104 are large, then when the dicing tape 4 which underlies the chip 1C adjacent to the chip 1C to be peeled off is sucked by the grooves 104, the interface between the adjacent chip 1C and the underlying dicing tape 4 may be peeled off in the regions above the grooves 104. Such a peel-off phenomenon is apt to occur particularly when the dicing tape 4 uses a pressure-sensitive adhesive whose tackness is relatively weak. When such a phenomenon occurs, the chip adjacent to the chip to be peeled off may fall off from the dicing tape 4 during the work of peeling off the to-be-peeled-off chip 1C from the dicing tape 4. Thus, the phenomenon in question is undesirable. An effective measure for preventing the occurrence of such a phenomenon is to make the width and depth of each groove 104 as small as possible to prevent the formation of a gap between the dicing tape 4 which underlies the adjacent chip 1C and the upper surface of the chucking unit 102.

A first block 110A, a second block 110B and a third block 110C, which are for sticking up the dicing tape 4, are installed centrally of the chucking unit 102. Inside the first block 110A which is the largest in diameter there is disposed the second block 110B whose diameter is smaller than that of the first block, and inside the second block 110B there is disposed the third block 110C which is the smallest in diameter. As will be described later, the three first, second and third blocks 110A, 110B, 110C are adapted to move up and down in interlock with a first helical compression spring 111A interposed between the first block 110A as an outside spring and the second block 110B as an intermediate spring, a second helical compression spring 111B interposed between the intermediate second block 110B and the third block 110C as an inside block and having a spring constant larger than that of the first helical compression spring 111A, and a pusher 112 coupled to the third block 110C and adapted to be moved up and down by a drive mechanism (not shown).

Preferably, of the three first to third blocks 110A, 110B and 110C, the outside first block 110A which is the largest in diameter is a size smaller (for example about 0.5 to 3 mm smaller) in diameter than the chip to be peeled off. For example, in the case where the chip 1C is square in shape, the first block 110A is preferably in a square shape which is a size smaller than the chip. In case of the chip 1C being rectangular in shape, the first block 110A is preferably in a rectangular shape a size smaller than the chip. As a result, the corners as outer periphery portions of the upper surface of the first block 110A are positioned slightly inside the outer edge of the chip 1C and therefore a force for peeling off the chip 1C and the dicing tape 4 can be concentrated on the portion (the outermost periphery portion of the chip 1C) which serves as a starting point of peel-off of both chip and dicing tape.

In order to ensure a required area of contact with the dicing tape 4 it is preferable that the upper surface of the first block 110A be a flat surface or a surface having a large radius of curvature. In the case where the area of contact between the upper surface of the first block 110A and the dicing tape 4 is small, a large bending stress is concentrated on the peripheral portion of the chip 1C which is borne from below by the upper surface of the first block 110A, so that there is a fear of cracking of the chip peripheral portion.

The intermediate second block 110B disposed inside the first block 110A has a diameter smaller by about 1 to 3 mm than that of the first block 110A. The third block 110C of the smallest diameter disposed still inside the second block 110B has a diameter still smaller by about 1 to 3 mm than that of the second block 110B. In this first embodiment, taking the easiness of machining into account, the intermediate second block 110B and the inside third block 110C are made columnar in shape, but may be in a quadrangular prism shape like the outside first block 110A or a shape similar thereto. Upper surfaces of the three first to third blocks 110A, 110B and 110C are equal in height to one another and are also equal in height to the peripheral portion of the upper surface of the chucking unit 102 in an initial state (the blocks 110A, 110B and 110C are not in operation).

As shown on a larger scale in FIG. 12, a gap (S) is formed between the peripheral portion of the chucking unit 102 and the outside first block 110A and like gaps (S) are also formed among the three first to third blocks 110A, 110B and 110C. The interiors of the gaps (S) are pressure-reduced by a suction mechanism (not shown). When the back surface of the dicing tape 4 comes into contact with the upper surface of the chucking unit 102, the dicing tape 4 is sucked downward into close contact with the upper surfaces of the first to third blocks 110A, 110B and 110C.

The die bonder used in this first embodiment is provided with a camera (image pickup means) CAM1, but the details such as function, structure and operation of the camera CAM1 will be described later.

In the die bonding process in this first embodiment, first the wafer 1W taken out from the wafer cassette WC is put on the XY table HT and is conveyed to a reference position at which pickup of the chip 1C is performed (this operation will hereinafter be referred to as wafer loading (step P1)). Subsequently, a fine adjustment (wafer alignment) is performed so that the disposed position of the wafer 1W becomes exactly coincident with the reference position (step P2).

Next, the XY table with the wafer 1W placed thereon is moved (wafer pitch) at a predetermined pitch and is held horizontally, whereby the chip 1C to be picked up first is disposed at a pickup position (step P3).

Then, the main surface (upper surface) of the chip (first semiconductor chip) 1C to be picked up is photographed by the camera CAM1 and a positional deviation quantity from the pickup position of the chip 1C to be picked up is calculated on the basis of the image acquired (step P4). On the basis of the positional deviation quantity the XY table HT with the wafer 1W placed thereon is moved to dispose the to-be-picked-up chip 1C exactly at the pickup position. If the position of the chip 1C cannot be recognized, the processing flow shifts to step P5 to be described later, while when the chip position can be recognized, the positional deviation is corrected and thereafter the processing flow advances to step P8 to be described later.

Figure 14:
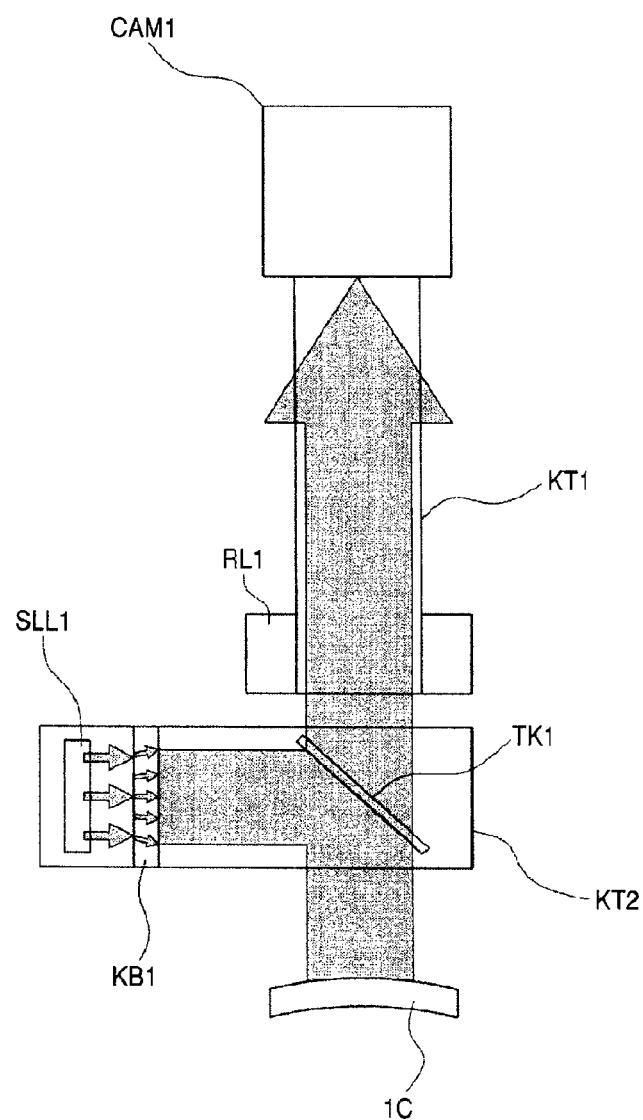
FIG. 14 is an explanatory diagram showing a layout of a camera and a lighting mechanism both used in the die bonding process in the manufacture of the semiconductor device according to the first embodiment.
Figure 15:
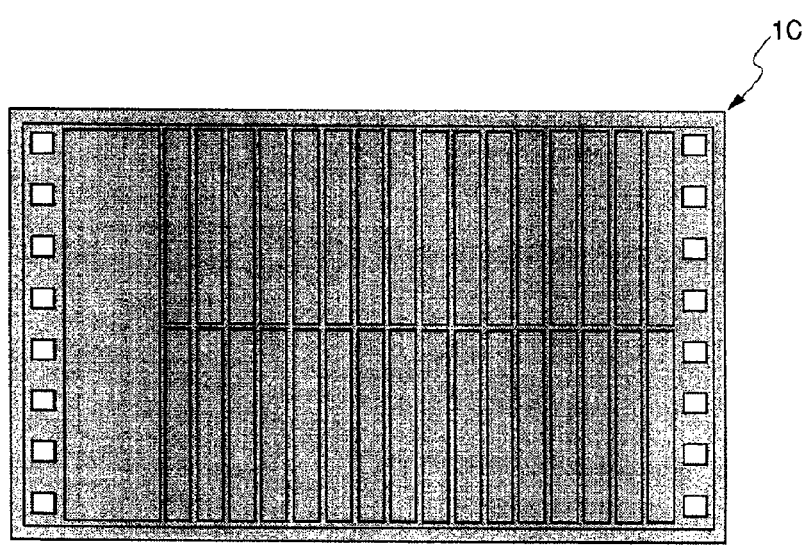
FIG. 15 is an explanatory diagram showing an image of a main surface of a chip obtained in the die bonding process in the manufacture of the semiconductor device according to the first embodiment.

FIG. 14 is an explanatory diagram showing a layout of the camera CAM1 and a lighting mechanism for radiating image photographing light to the chip 1C to be picked up.

As shown in FIG. 14, the camera CAM 1 is coupled to one end of the lens barrel KT1 and an objective lens (not shown) is attached to an opposite end of the lens barrel KT1. An image of a main surface of a chip 1C is photographed through the objective lens. A ring lighting unit RL1 is mounted around the objective lens-attached end of the lens barrel KT1. The ring lighting unit RL1 functions as an auxiliary lighting unit which is turned ON for example when the image of a chip 1C obtained by the camera CAM1 is not clear.

Between the lens barrel KT1 and the chip 1C is disposed a lens barrel KT2, the lens barrel KT2 being provided in the interior thereof with a surface-emitting lighting unit (first light source, first surface-emitting light source) SSL1, a diffusing plate (first diffusing plate) KB1 and a half mirror (semitransparent mirror) TK1. Irradiation light emitted from the surface-emitting lighting unit SSL1 becomes scattered light by passing through the diffusing plate KB1. With the half mirror TK1, the scattered light is reflected along the same optical axis as that of the camera CAM1 and is radiated to the chip 1C. The scattered light (first irradiation light) thus radiated to the chip 1C along the same optical axis as that of the camera CAM1 is reflected by the chip 1C and specularly reflected light (first reflected light) passes through the half mirror TK1, reaches the camera CAM1 and forms an image of the chip 1C. That is, the lens barrel KT2 has the function of coaxial drop lighting (coaxial lighting).

The silicon which forms the wafer 1W and a thin film formed on the wafer are different in thermal expansion coefficient. Therefore, if the chip 1C becomes as thin as about 100 μm or less for example, there may occur warping of the chip 1C due to stress induced between the silicon and the thin film. The thinner the chip 1C, the more marked the warping of the chip. In such a case, if there is adopted a configuration wherein light is radiated to only a small area of the main surface of the chip 1C, variations in illuminance within the chip main surface become larger, so that the image of the chip 1C becomes unclear partially and it may become impossible to determine whether the chip 1C to be picked up is located exactly at the pickup position.

In this first embodiment, as described above, the irradiation light from the surface-emitting lighting unit SSL1 which in itself becomes large in irradiation area is allowed to pass through the diffusing plate kB1, thereby obtaining diffused light with reduced unevenness in irradiation, then the diffused light thus reduced in irradiation unevenness is radiated to the main surface of the chip 1C. Therefore, the irradiation light from the light source (the surface-emitting lighting unit SSL1) can be radiated to a large area of the chip main surface. As a result, specularly reflected light reflected by the chip 1C and traveling through the interior of the lens barrel KT1 is incident on the camera CAM1 in a large area and hence the image of the chip 1C can be prevented from becoming partially unclear (see FIG. 15), thus making it possible to easily determine whether the chip 1C to be picked up is exactly disposed at the pickup position or not. According to an experiment conducted by the present inventors, when an image of the main surface of the chip 1C is obtained by the configuration shown in FIG. 14, it was possible to obtain a clear image even in case of the thickness of the chip 1C being as small as about 50 to 70 µm.

Figure 16:
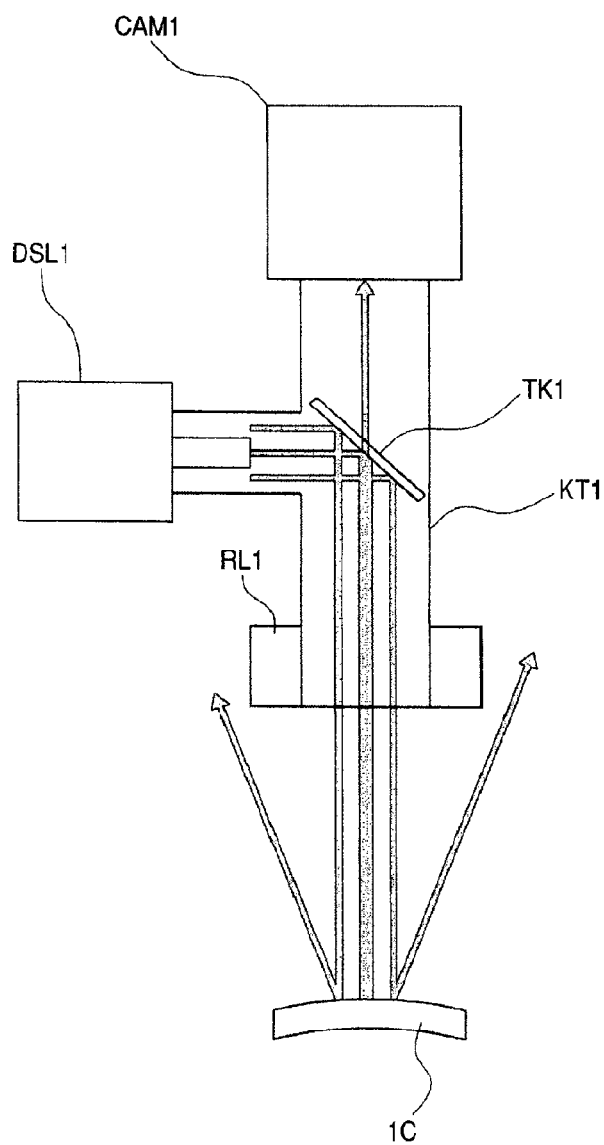
FIG. 16 is an explanatory diagram showing a camera—lighting mechanism layout in comparison with that adopted in the die bonding process in the manufacture of the semiconductor device according to the first embodiment.
Figure 17:
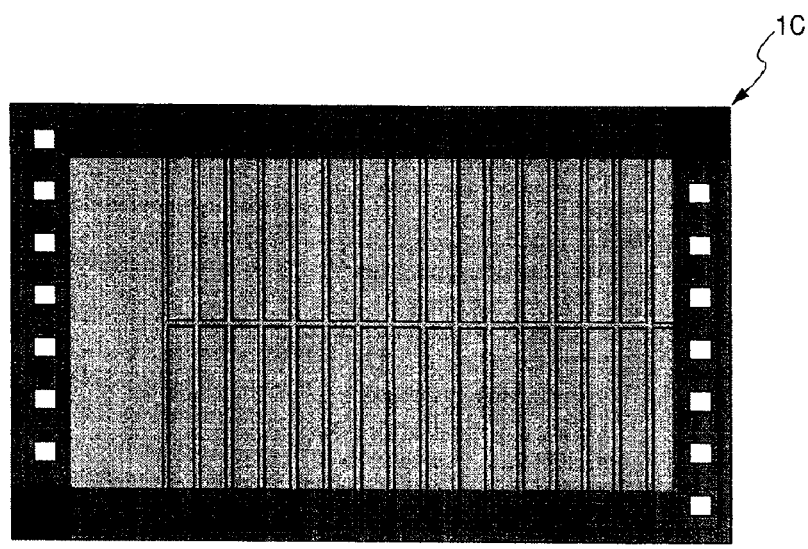
FIG. 17 is an explanatory diagram showing an image of a main surface of a chip obtained by the configuration of FIG. 16.

In the case of a configuration using a coaxial spot lighting unit DSL1 as shown in FIG. 16, in comparison with the configuration of the first embodiment using both surface-emitting lighting unit SSL1 and diffusing plates KB1, parallel light emitted from the coaxial spot lighting unit DSL1 is reflected along the same optical axis as that of the camera CAM1 by the half mirror TK1 and is radiated to the chip 1C in a small area. Therefore, if the chip 1C is warped, reflected light from an area relatively close to the outer periphery of the chip 1C, which is included in the reflected light from the chip 1C, is reflected to the exterior of the lens barrel KT1, so that a specularly reflected light component incident on the interior of the lens barrel KT1 is incident on the camera CAM1 in a smaller area than in the case of the irradiation light to the chip 1C. Consequently, the image of the chip 1C becomes unclear partially, particularly in its outer periphery portion, (see FIG. 17). As noted above, such an inconvenience can be prevented according to this first embodiment.

When the position of the chip 1C to be picked up could not be recognized in step P4, the main surface of the chip 1C to be picked up is again photographed by the camera CAM1 under an altered irradiation condition of light to the chip 1C with use of such means as turning ON or OFF the ring lighting unit RL1, then a positional deviation quantity of the to-be-picked-up chip 1C from the pickup position is calculated from the image thus obtained (step P5). On the basis of this positional deviation quantity the XY table HT with the wafer 1W placed thereon is moved to dispose the to-be-picked-up chip 1C exactly to the pickup position. This is the same as in step P4. When the position of the chip 1C could not be recognized from the acquired image of the chip 1C, the processing flow shifts to step P6 to be described later, while when it was possible to effect the recognition, the positional deviation is corrected and thereafter the processing flow advances to step P8.

When the position of the chip 1C to be picked up could not be recognized in step P5, a check is made to see if the chip 1C to be picked up is not present on the dicing tape 4 on the basis of the image obtained by the camera CAM1 (step P6). That the chip 1C to be picked up is not present means that the chip has already been picked up. When it is determined that the presence or absence of the chip 1C to be picked up is uncertain, an error signal is outputted to stop the die bonding process (step P7). In this first embodiment, as noted earlier, the image of the chip 1C can be prevented from becoming unclear, so when the chip 1C to be picked up is present, it is possible to prevent the processing flow from advancing to step P6. Thus, it is possible to greatly diminish the case of the processing flow advancing to the error output of step P7. That is, it becomes possible to greatly improve the productivity of the semiconductor device in this first embodiment. When it is confirmed in step P7 that the chip 1C to be picked up is not present, the step P3 is again carried out, thereby causing the XY table HT with the wafer 1W placed thereon to move at a predetermined pitch (wafer pitch) and let the to-be-next-picked-up pitch 1C be disposed at the pickup position.

After the chip 1C to be picked up is disposed exactly at the pickup position, the chip 1C is checked for appearance on the basis of the image obtained by the camera CAM1 (step P8). When it is determined that there is no problem with the chip appearance, the processing flow advances to step P9 to be described later, while when it is determined that there is a problem, the chip 1C in question is skipped and thereafter the step P3 is carried out, thereby causing the XY table HT with the wafer 1W placed thereon to move at a predetermined pitch (wafer pitch) and let the to-be-next-picked-up chip 1C be disposed at the pickup position.

When it is determined by the above appearance check that there is no problem, it is determined whether the chip 1C to be picked up is good or bad (step P9). The chip 1C has beforehand gone through a probe check or the like and a mark has been put on the main surface of the chip with use of ink or the like if the chip is bad. When this mark is recognized from the image obtained by the camera CAM1, the chip 1C to be picked up is determined to be bad and the step P3 is again carried out, thereby causing the XY table HT with the wafer 1W placed thereon at a predetermined pitch (wafer pitch) and let the to-be-next-picked-up chip 1C be disposed at the pick up position.

The to-be-picked-up chip 1C determined to be good in step P9 is picked up from the dicing tape 4 by the bonding head BH which includes the chucking collet and is die-bonded to a wiring substrate 11.

Figure 18:
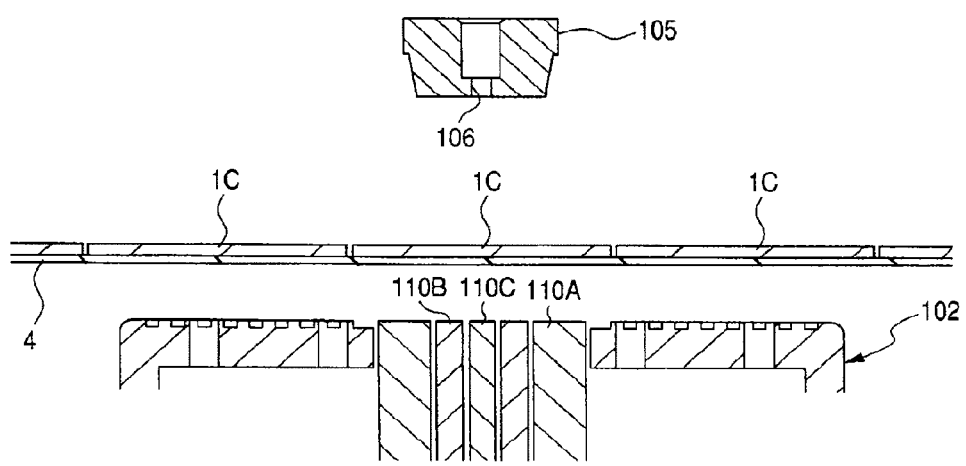
FIG. 18 is an enlarged sectional view of the upper surface of the chucking unit and the vicinity thereof, illustrating a semiconductor chip peeling method.

For peeling off the chip 1C from the dicing tape 4 by both the bonding head BH including the chucking collet and the chucking unit 102, first, as shown in FIG. 18, the central portion (the first, second and third blocks 110A, 110B, 110C) of the chucking unit 102 is moved to just under one chip 1C to be peeled off (the chip 1C positioned centrally of the same figure) and at the same time the chucking collet 105 is moved to above the chip 1C. A chucking port 106 the interior of which is pressure-reduced is formed centrally of a bottom of the chucking collet 105 supported by the bonding head BH, whereby only one chip 1C to be peeled off can be chucked and held selectively.

Figure 19:
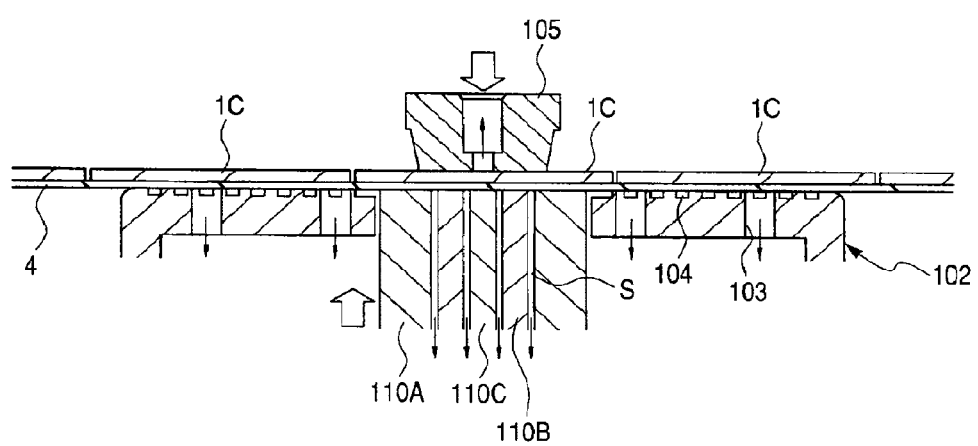
FIG. 19 is an enlarged sectional view of the upper surface of the chucking unit and the vicinity thereof, illustrating the semiconductor chip peeling method.

Next, as shown in FIG. 19, the chucking unit 102 is raised until the upper surface thereof comes into contact with the back surface of the dicing tape 4. At the same time, the interiors of the suction ports 103, grooves 104 and gaps (S) are pressure-reduced. As a result, the dicing tape 4 which is in contact with the chip 1C to be peeled off comes into close contact with the upper surfaces of the first, second and third blocks 110A, 110B, 110C. Further, the dicing tape 4 which is in contact with another chip 1C adjacent to the above chip 1C comes into close contact with the peripheral portion of the upper surface of the chucking unit 102. At this time, if the chucking unit 102 is thrust up slightly (e.g., about 400 µm), tension can be further applied to the dicing tape 4 to which a horizontal tension has been applied by the presser plates 7 and the expanding ring 8, so that the chucking unit 102 and the dicing tape 4 can be brought into close contact with each other in a more positive manner.

The chucking collet 105 is brought down almost simultaneously with the ascent of the chucking unit 102 until the bottom of the collet comes into contact with the upper surface of the chip 1C to be peeled off, thereby chucking the chip 1C with a chucking force of about 80 kPa and pressing down the chip slightly. By thus sucking the chip 1C upward with use of the chucking collet 105 at the time of sucking the dicing tape 4 downward with use of the chucking unit 102, it is possible to promote separation between the chip 1C and the dicing tape 4 by thrusting-up of the first, second and third blocks 110A, 110B, 110C.

Figure 20:
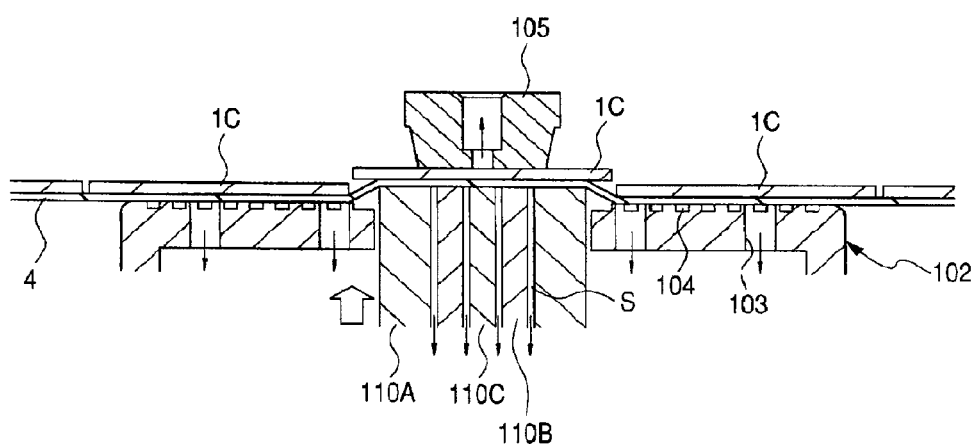
FIG. 20 is an enlarged sectional view of the upper surface of the chucking unit and the vicinity thereof, illustrating the semiconductor chip peeling method.
Figure 21:
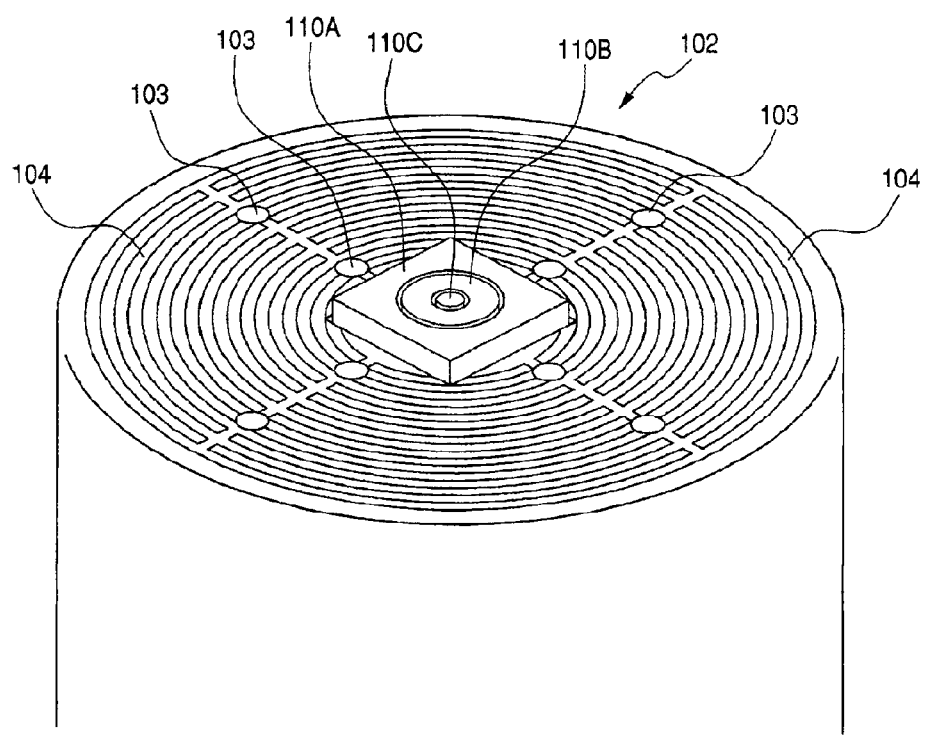
FIG. 21 is an enlarged perspective view of the upper surface of the chucking unit and the vicinity thereof, illustrating the semiconductor chip peeling method.

Next, as shown in FIG. 20, the three first to third blocks 110A, 110B and 110C are thrust up simultaneously to apply an upward load to the back surface of the dicing tape 4, thereby pushing up the chip 1C and the dicing tape 4. At this time, the back surface of the chip 1C is supported by the upper surfaces (contact surfaces) of the first, second and third blocks 110A, 110B, 110C to diminish a bending stress imposed on the chip 1C. Further, the outer periphery (corners) of the upper surface of the first block 110A is disposed inside the outer periphery of the chip 1C, whereby a peeling stress is concentrated on the interface as a starting point of separation between the chip 1C and the dicing tape 4 and the peripheral edge portion of the chip 1C is peeled off efficiently from the dicing tape 4. At this time, the dicing tape 4 which underlies another chip adjacent to the chip 1C to be peeled off is sucked downward into close contact with the peripheral portion of the upper surface of the chucking unit 102, whereby it is possible to promote release of the dicing tape 4 at the peripheral edge portion of the chip 1C. FIG. 21 is an enlarged perspective view showing the upper surface of the chucking unit 102 and the vicinity thereof (the chip 1C and the dicing tape 4 are not shown).

A thrust-up quantity (stroke) of the first, second and third blocks 110A, 110B, 110C is, for example, about 0.4 mm, provided the stroke may change depending the angle required for separation. The pressure-sensitive adhesive applied to the dicing tape 4 differs in tackness depending on the manufacturer and type. Therefore, even when the size of the chip 1C is the same, if there is used a pressure-sensitive adhesive having a large tackness, it is necessary to increase the stroke and thereby ensure a required peeling angle.

When thrusting up the first, second and third blocks 110A, 110B, 110C to apply a load to the back surface of the chip 1C, it is preferable that at the outermost periphery portion of the chip 1C a bending stress acting in a direction orthogonal to the chip outer periphery be made smaller than that acting in a direction parallel to the chip outer periphery. In the outmost periphery portion of the chip 1C there remain fine cracks which occurred when the wafer 1W was diced using the dicing blade 6. Therefore, if a strong bending stress acting in a direction orthogonal to the outer periphery of the chip 1C is imposed on the outermost periphery portion of the chip when thrusting up the first, second and third blocks 110A, 110B, 110C, there is a fear that the cracks may grow and cause cracking of the chip 1C. In this first embodiment, a uniform load is applied to a position slightly inside the outermost periphery portion of the chip 1C with use of the first block 110A whose upper surface is a size smaller than the chip 1C, so that the entire peripheral edge portion of the chip 1C can be peeled off uniformly from the dicing tape 4 while avoiding the above-mentioned problem.

Figure 22:
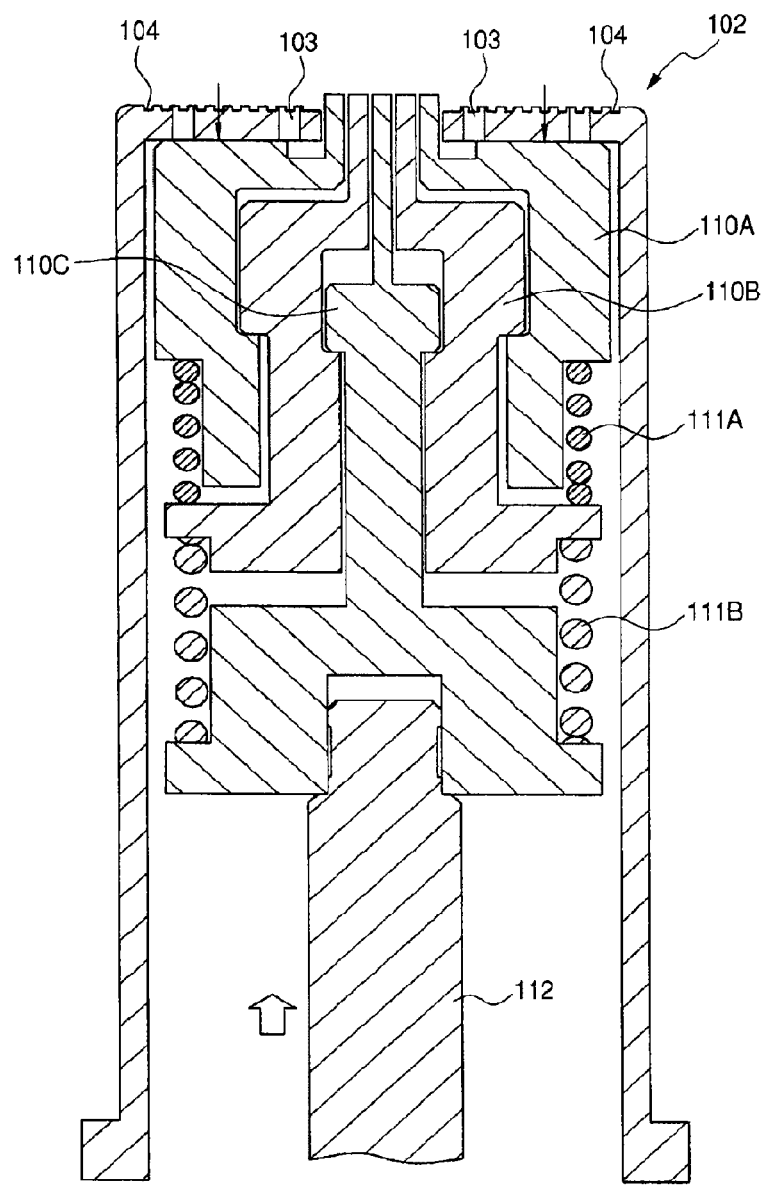
FIG. 22 is a sectional view of the chucking unit, illustrating the semiconductor chip peeling method.

For thrusting up the three first to third blocks 110A, 110B and 110C at a time, the pusher 112 is pushed up to push up the inside third block 110C coupled to the pusher 112, as shown in FIG. 22. As a result, the intermediate second block 110B is pushed up with the resilience of the helical compression spring 111B interposed between the inside third block 110C and the intermediate second block 110B, further, the outside first block 110A is pushed up with the resilience of the helical compression spring 111A interposed between the outside first block 110A and the intermediate second block 110B. Consequently, the three first to third blocks 110A, 110B and 110C are pushed up simultaneously. Then, a part (the surface indicated with an arrow in the figure) of the outside first block 110A comes into contact with the peripheral portion of the chucking unit 102, whereby the rising motion of the first, second and third blocks 110A, 110B, 110C stops. At this time, the greater area of the chip 1C to be peeled off is supported by the upper surfaces of the three first to third blocks 110A, 110B and 110C and the separation at the interface between the chip 1C and the dicing tape 4 proceeds efficiently in the area outside the outer periphery (corners) of the upper surface of the first block 110A.

When thrusting up the three first to third blocks 110A, 110B and 110C simultaneously, the pusher 112 pushes up the third block 110C with such a weak force as does not cause contraction of the helical compression spring 111A whose resilience is weak. By so doing, there is no fear that the intermediate second block 110B and the inside third block 110C may further thrust up after the contact of a part of the outside first block 110A with the peripheral portion of the chucking unit 102.

It is necessary for the helical compression spring 111A to have such a degree of resilience as can lift the first block 110A against at least the tension of the dicing tape 4. In the case where the resilience of the helical compression spring 111A is smaller than the tension of the dicing tape 4, the outside first block 110A is not lifted even by operation of the pusher 112, so that the chip 1C can no longer be supported by the outside first block 110A. In this case, it is impossible to concentrate a sufficient stress on the start point of separation between the chip 1C and the dicing tape 4, so there may occur a problem such as a lowering of the peeling speed or cracking of the chip 1C under an excessive bending stress applied thereto.

Figure 23:
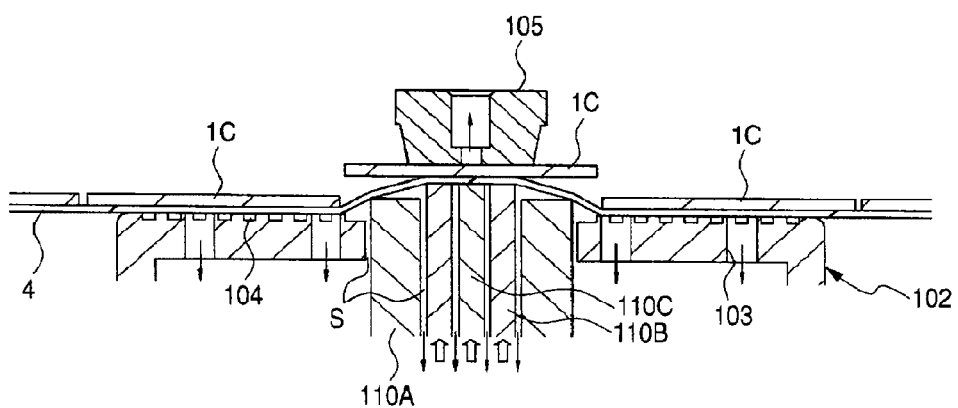
FIG. 23 is an enlarged sectional view of the upper surface of the chucking unit and the vicinity thereof, illustrating the semiconductor chip peeling method.
Figure 24:
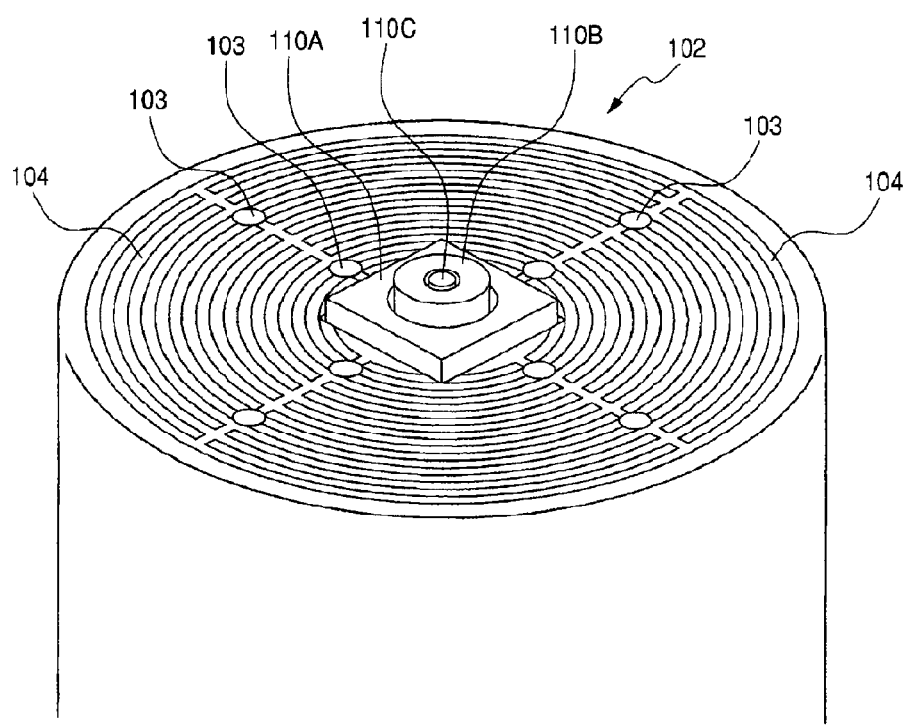
FIG. 24 is an enlarged perspective view of the upper surface of the chucking unit and the vicinity thereof, illustrating the semiconductor chip peeling method.

Next, as shown in FIG. 23, the intermediate second block 110B and the inside third block 110C are thrust up simultaneously to push up the dicing tape 4. As a result, the position of the outer periphery (corners) of the upper surface of the second block 110B which supports the chip 1C shifts to a more inside position in comparison with that of the chip supported by the first block 110A, so that the separation between the chip 1C and the dicing tape 4 proceeds toward the center of the chip from the area located outside the outer periphery of the upper surface of the second block 110B. FIG. 24 is an enlarged perspective view showing the upper surface of the chucking unit 102 and the vicinity thereof in this state (the chip 1C and the dicing tape 4 are not shown).

Figure 25:
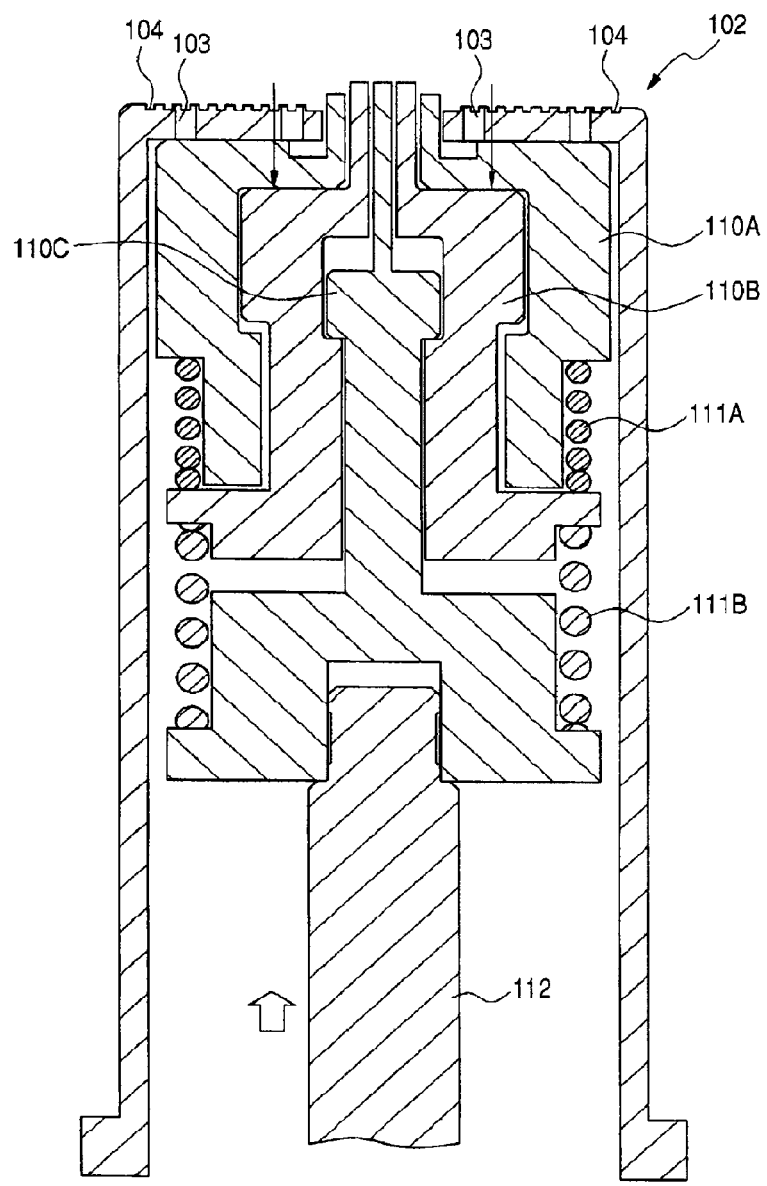
FIG. 25 is a sectional view of the chucking unit, illustrating the semiconductor chip peeling method.

For thrusting up both the second block 110B and the inside third block 110C simultaneously, the pusher 112 is pushed up to further push up the third block 110C coupled to the pusher 112, as shown in FIG. 25. At this time, the intermediate second block 110B is pushed up with the resilience of the helical compression spring 111B, so that both the second block 110B and the inside third block 110C are pushed up simultaneously. Then, the ascent of both the second block 110B and the inside third block 110C stops upon contact of a part (the surface indicated with an arrow in the figure) of the intermediate second block 110B with the outside first block 110A. The force of the pusher 112 for pushing up the third block 110C is set at a magnitude at which the helical compression spring 111A of a weak resilience is contracted but the helical compression spring 111B of a strong resilience is not contracted. By so doing, there is no fear that the inside third block 110C may further thrust up after the contact of a part of the intermediate second block 110B with the outside first block 110A.

When thrusting up both the second block 110B and the inside third block 110C, the interiors of the gaps (S) among the first, second and third blocks 110A, 110B, 110C are pressure-reduced to suck the dicing tape 4 in contact with the chip 1C downward in order to promote the separation between the chip 1C and the dicing tape 4. Moreover, the interiors of the grooves 104 are pressure-reduced to bring the dicing tape 4 in contact with the peripheral portion of the upper surface of the chucking unit 102 into close contact with the upper surface of the chucking unit 102 (see FIG. 23).

Figure 26:
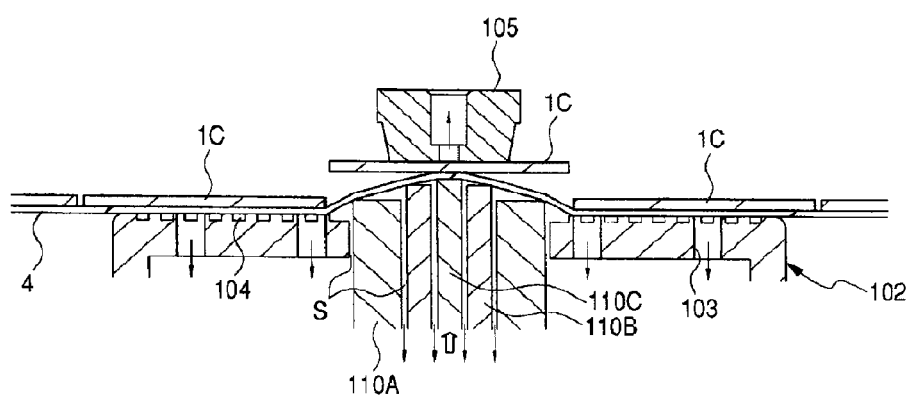
FIG. 26 is an enlarged sectional view of the upper surface of the chucking unit and the vicinity thereof, illustrating the semiconductor chip peeling method.
Figure 27:
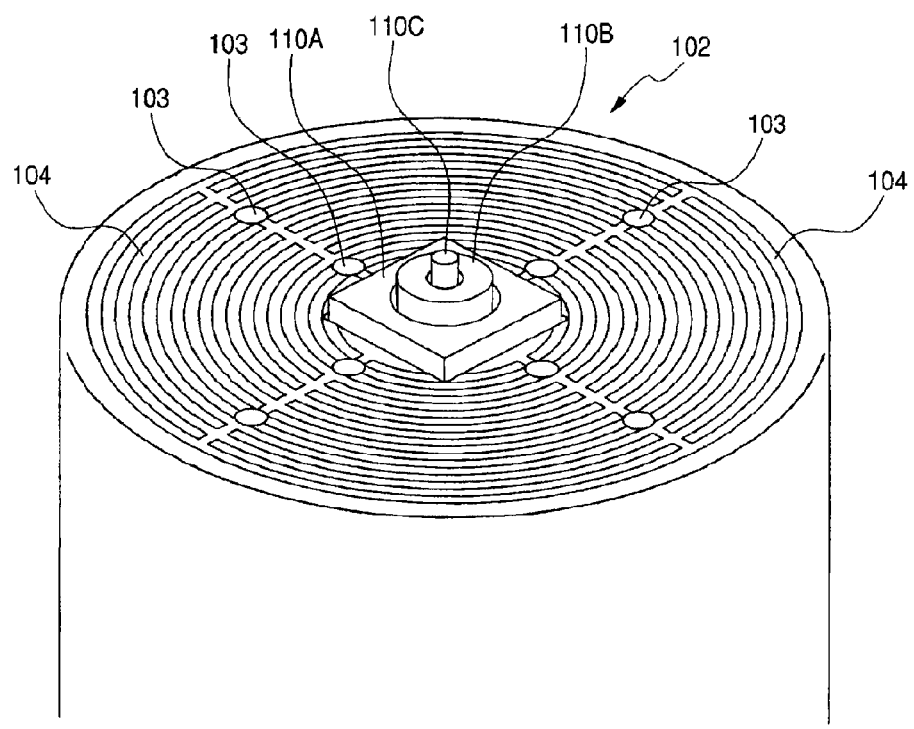
FIG. 27 is an enlarged perspective view of the upper surface of the chucking unit and the vicinity thereof, illustrating the semiconductor chip peeling method.
Figure 28:
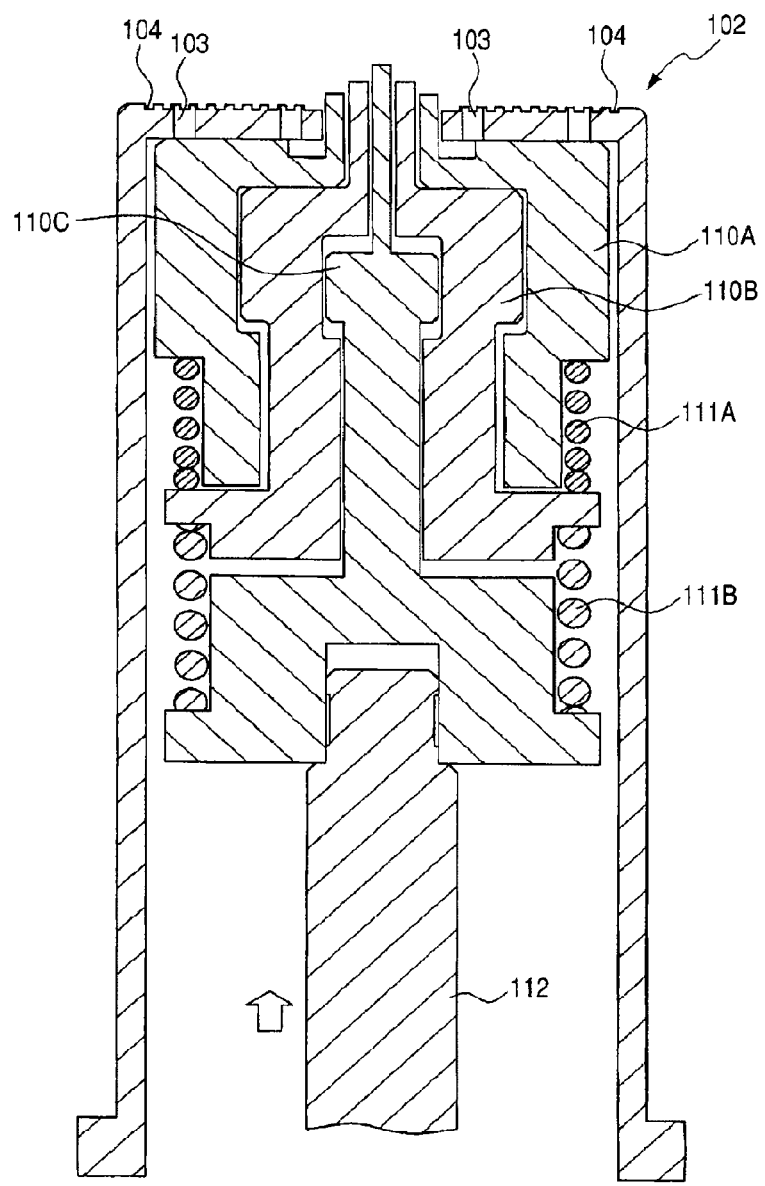
FIG. 28 is a sectional view of the chucking unit, illustrating the semiconductor chip peeling method.

Next, as shown in FIG. 26, the inside third block 110C is further thrust up to push up the back surface of the dicing tape 4 and support the back surface of the chip 1C by the upper surface of the third block 110C. FIG. 27 is an enlarged perspective view showing the upper surface of the chucking unit 102 and the vicinity thereof in this state (the chip 1C and the dicing tape 4 are not shown). For thrusting up the inside third block 110C, the third block 110C is pushed up with such a strong force as causes contraction of the helical compression spring 111B, as shown in FIG. 28. As a result, the separation between the chip 1C and the dicing tape 4 proceeds in the area located outside the outer periphery (corners) of the upper surface of the third block 110C which is in contact with the dicing tape 4.

Figure 29:
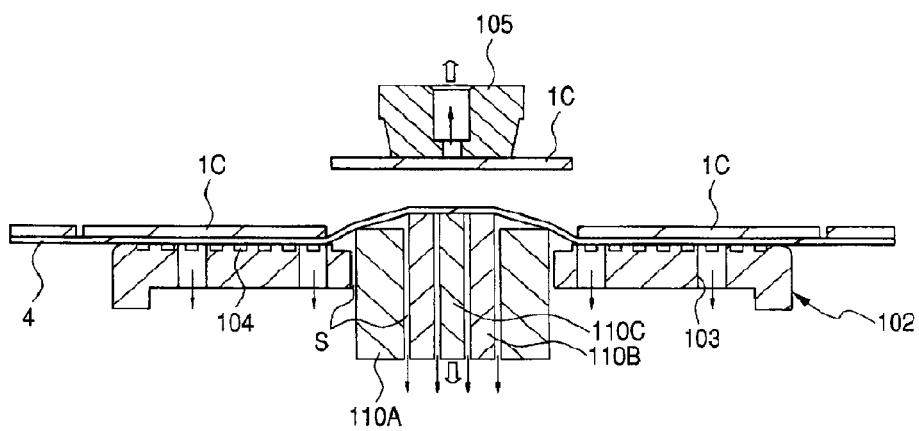
FIG. 29 is an enlarged sectional view of the upper surface of the chucking unit and the vicinity thereof, illustrating the semiconductor chip peeling method.

Subsequently, as shown in FIG. 29, third block 110C is pulled down and the chucking collet 105 is pulled up, whereby the work of peeling off the chip 1C from the dicing tape 4 is completed.

It is necessary for the area of the upper surface of the third block 110C to be set small to the extent that the chip 1C peels off from the dicing tape 4 with only the sucking force of the chucking collet 105 when the third block 110C is thrust up. If the area of the third block 110C is large, the area of contact between the chip 1C and the dicing tape 4 becomes large and so does the tackness of the two. Therefore, with only the suction force of the chucking collet 105 for the chip 1C, it is impossible to peel off the chip from the dicing tape 4.

On the other hand, when the area of the upper surface of the third block 110C is set small, a strong load is concentrated in a narrow area (central portion) of the chip 1C, so in an extreme case the chip 1C may be cracked. Therefore, when thrusting up the block 110C, it is preferable that a strong load be prevented from being applied to the narrow area of the chip 1C, for example, by decreasing the thrusting-up speed, by shortening the time of contact of the upper surface of the third block 110C with the dicing tape 4, or by decreasing the thrust-up quantity (stroke) of the third block 110C (e.g., about 0.2 to 0.4 mm).

One effective method for increasing the suction force of the chucking collet 105 is to decrease the pulling-up speed of the chucking collet. If the chucking collet 105 is pulled up rapidly in a state in which a part of the chip 1C is in close contact with the dicing tape 4, a gap is formed between the bottom of the chucking collet 105 and the upper surface of the chip 1C and the degree of vacuum in the interior of the chucking collet decreases, so that the suction force for the chip 1C decreases. On the other hand, in the case where the pulling-up speed of the chucking collet 105 is decreased, the time required for peeling off the chip 1C from the dicing tape 4 becomes longer. In view of this point it is preferable that the pulling-up speed of the chucking collet 105 be made variable and the pulling-up speed be made low when starting the pulling-up operation to ensure a sufficient suction force and that the pulling-up speed be made high when the area of contact between the chip 1C and the dicing tape 4 has become somewhat small, thereby preventing the delay of the peeling time. Making the area of the bottom of the chucking collet 105 larger than that of the upper surface of the third block 110C is also an effective method for increasing the suction force of the chucking collet 105.

By thus increasing the suction force of the chucking collet 105, the chip 1C can be peeled off from the dicing tape 4 with only the suction force of the chucking collet even when the area of contact between the chip 1C and the dicing tape 4 is relatively large. Consequently, not only the peeling time can be shortened, but also it is possible to avoid the above problem which occurs when the area of the upper surface of the third block 110C is set small.

If the third block 110C is pulled down in a state in which the chip 1C is forced down by the chucking collet 105, there is a fear that the chip 1C may strike against the third block 1C and be cracked because the chucking collet 105 also moves downward. When pulling down the third block 110C, therefore, it is preferable that the chucking collet 105 be pulled up just before pulling down the third block 110C or the position of the chucking collet be fixed at least so as not to move downward.

The chip 1C thus peeled off from the dicing tape 4 is chucked and held by the chucking collet 105 and is conveyed to the next process (pellet mounting process). When the chucking collet 105 which has conveyed the chip 1C to the next process returns to the chip pickup position, the next chip 1C is peeled off from the dicing tape 4 in accordance with the procedure shown in FIGS. 18 to 29. Thereafter, the other chips 1C are peeled off one by one from the dicing ape 4 in accordance with the same procedure (step P11). Upon completion of pickup of all the chips 1C, the dicing tape 4 and the wafer ring 5 which have held the chips 1C along the outline of the wafer 1W are unloaded to the wafer cassette WC (step P12).

Figure 30:
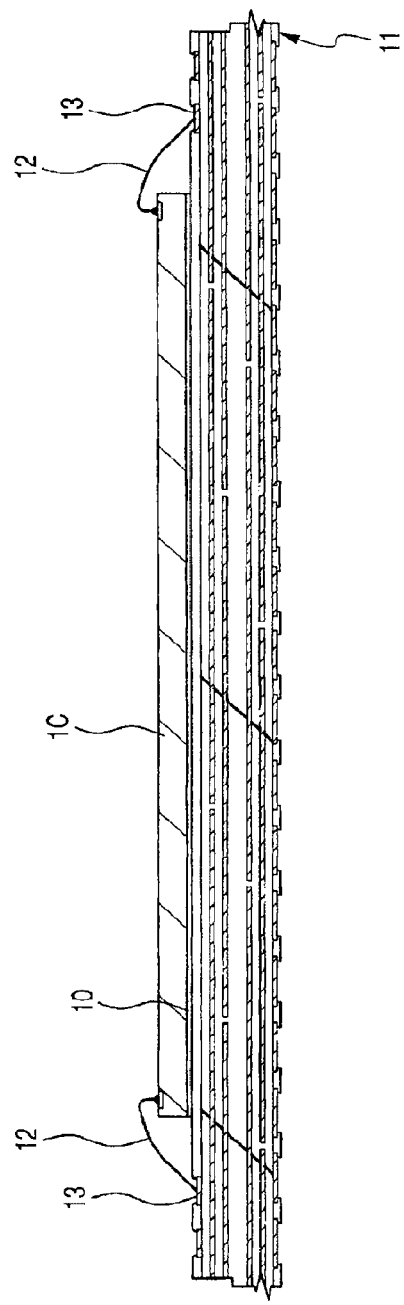
FIG. 30 is a sectional view of a wiring substrate, illustrating a process of mounting a semiconductor chip as pellet.

Next, as shown in FIG. 30, the chip 1C conveyed to the pellet mounting process is mounted to a mounting position (chip mounting area) on a wiring substrate (mounting substrate 11) by thermal compression bonding through a DAF 10 affixed beforehand to the chip back surface. Subsequently, the chip 1C is coupled electrically through Au wires 12 to electrodes 13 formed on the wiring substrate 11.

Figure 31:
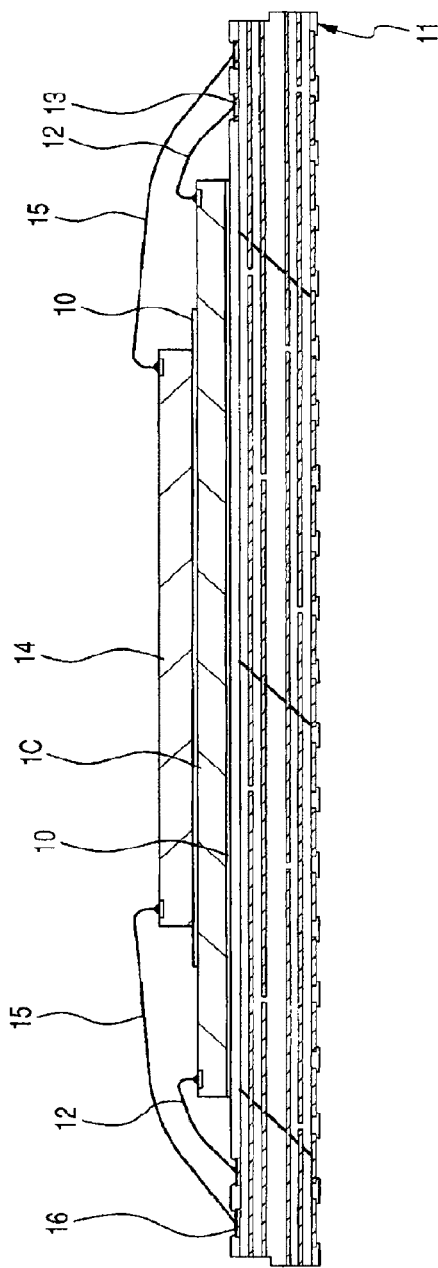
FIG. 31 is a sectional view of the wiring substrate, illustrating a semiconductor chip stacking and wire bonding process.

Next, as shown in FIG. 31, a second chip 14 is stacked through for example a DAF 10 onto the chip 1C mounted on the wiring substrate 11 and is coupled electrically through Au wires 15 to electrodes 16 formed on the wiring substrate 11. The second chip 14 is a silicon chip having an integrated circuit different from that formed on the chip 1C. After peeled off from the dicing tape 4 by the method described above, the second chip 14 is conveyed to the pellet mounting process and is stacked onto the mounting position (chip mounting area) on the chip 1C.

Figure 32:
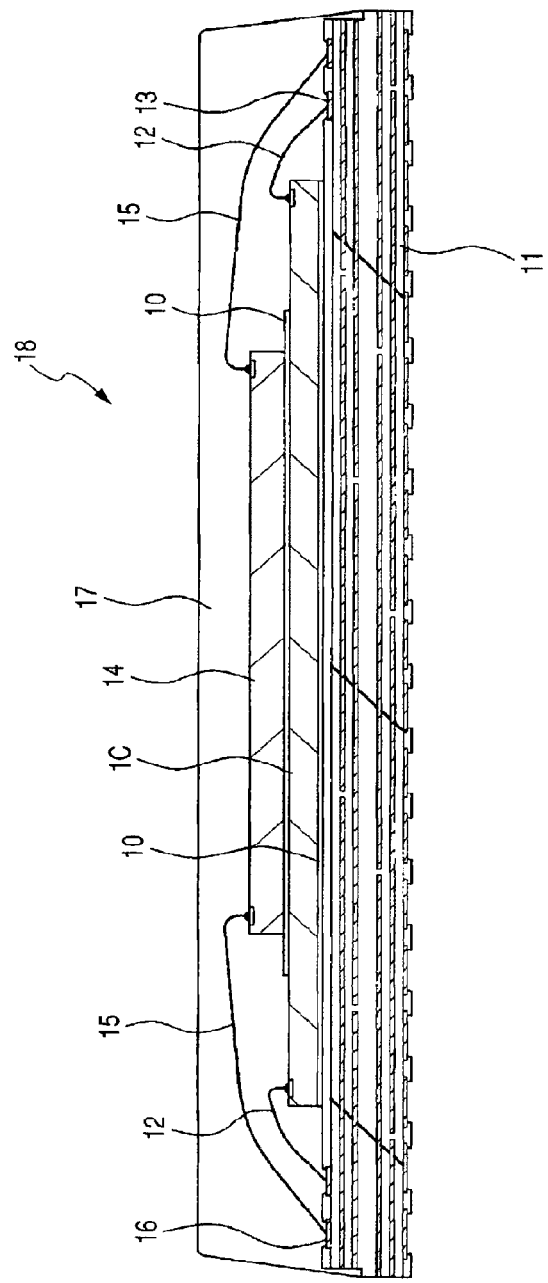
FIG. 32 is a sectional view of the wiring substrate, illustrating a semiconductor chip resin-sealing process.

Thereafter, the wiring substrate 11 is conveyed to a molding process and, as shown in FIG. 32, the chip 1C and the second chip 14 are sealed with molding resin 17 to complete a stacked package 18.

Although in this first embodiment a description has been given above about the method of peeling off each chip with use of three first to thick blocks 110A, 110B and 110C, the number of blocks is not limited to three, but there may be used four or more blocks in the case where the size of the chip 1C to be peeled off is large. Likewise, two blocks may be used in the case where the size of the chip 1C to be peeled off is very small.

Second Embodiment

Next, a second embodiment of the present invention will be described below.

Figure 33:
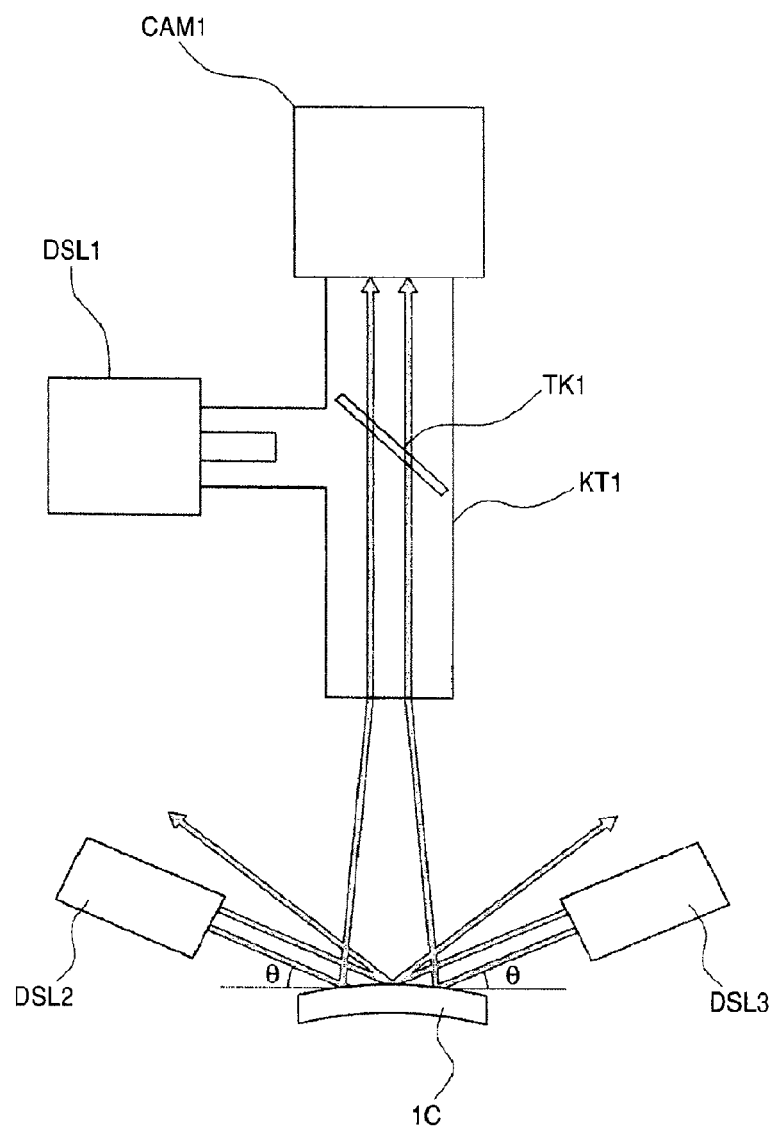
FIG. 33 is an explanatory diagram showing a layout of a camera and a lighting mechanism both used in a die bonding process in the manufacture of a semiconductor device according to a second embodiment of the present invention.
Figure 34:
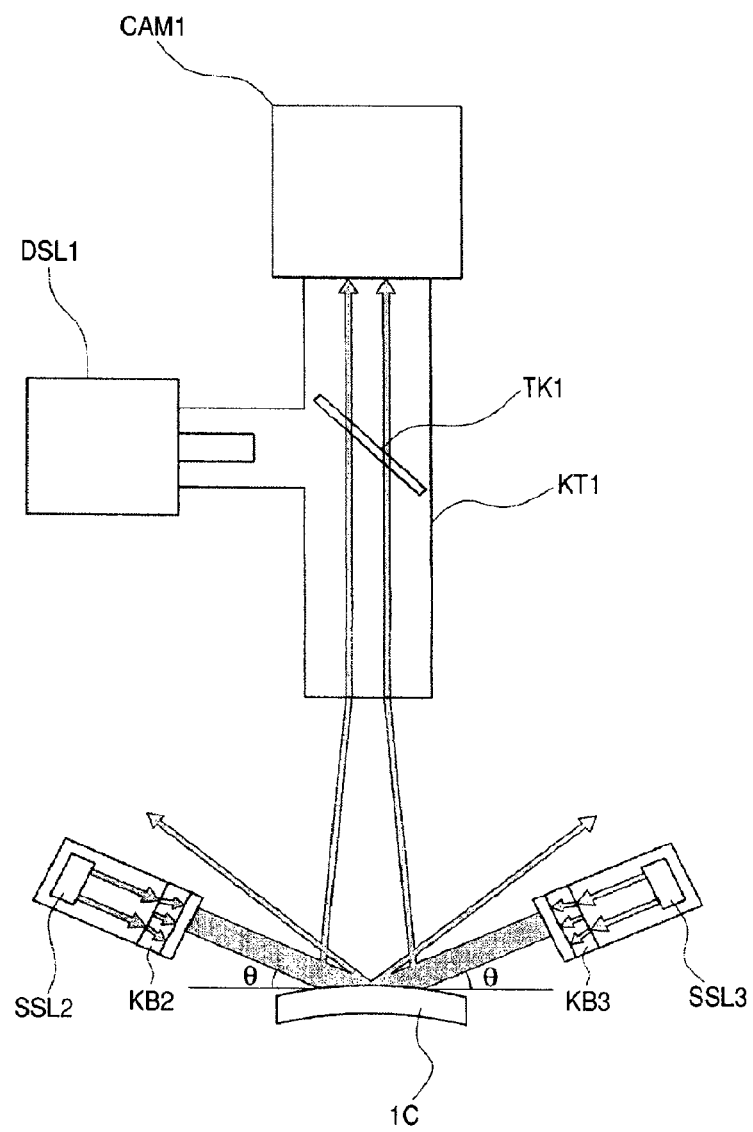
FIG. 34 is an explanatory diagram showing a layout of the camera and another lighting mechanism both used in the die bonding process in the manufacture of the semiconductor device according to the second embodiment.
Figure 35:
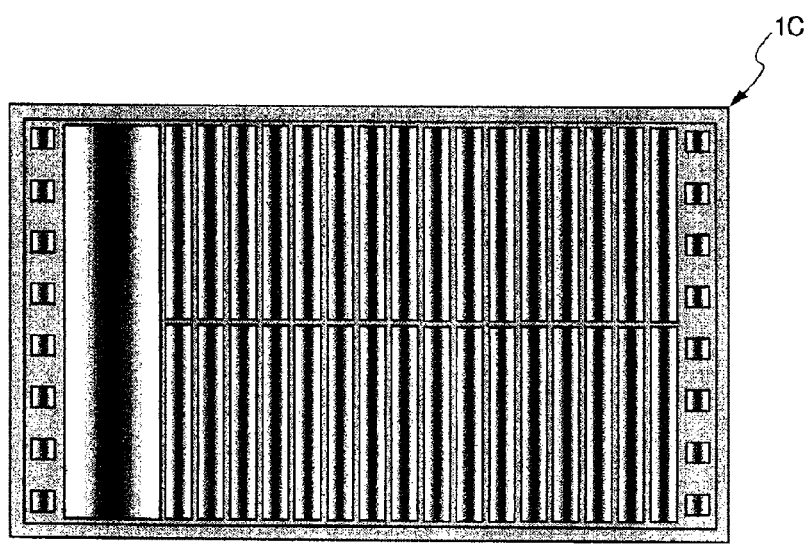
FIG. 35 is an explanatory diagram showing an image of a chip main surface obtained in the die bonding process in the manufacture of the semiconductor device according to the second embodiment.
Figure 36:
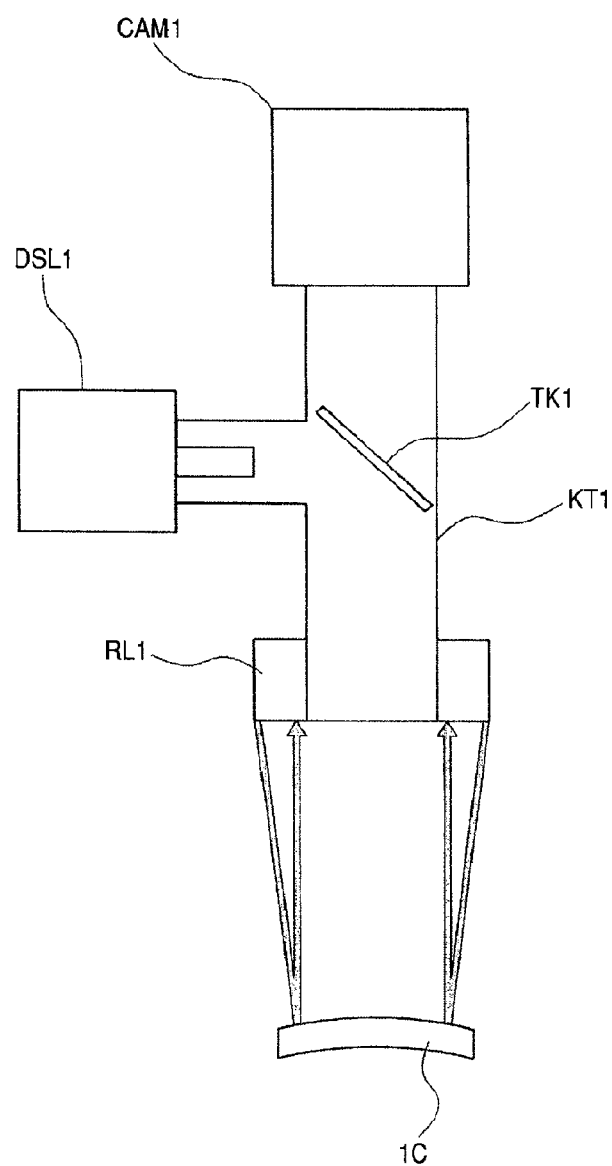
FIG. 36 is an explanatory diagram showing a camera—lighting mechanism layout in comparison with that adopted in the die bonding process in the manufacture of the semiconductor device according to the second embodiment.
Figure 37:
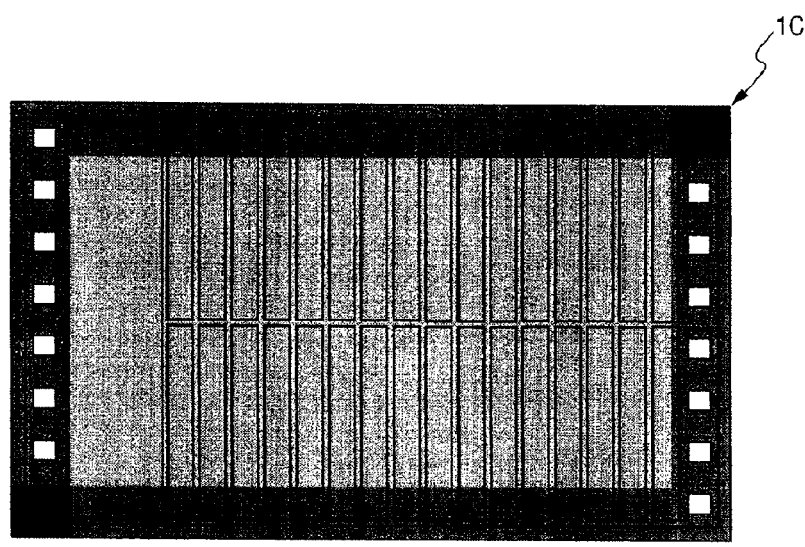
FIG. 37 is an explanatory diagram showing an image of a chip main surface obtained using the configuration of FIG. 36.

FIGS. 33 and 34 are explanatory diagrams each showing a layout of a camera and a lighting mechanism both used in a die bonding process in this second embodiment, the lighting mechanism radiating image photographing light to a chip 1C to be picked up. FIG. 35 is an explanatory diagram showing an image of a main surface of the chip obtained by the camera CAM1 in the configurations shown in FIGS. 33 and 34. FIG. 36 is an explanatory diagram showing a layout of a camera CAM1 and a lighting mechanism in comparison with the camera CAM1—lighting mechanism layouts shown in FIGS. 33 and 34. FIG. 37 is an explanatory diagram showing an image of the main surface of the chip 1C obtained by the configuration shown in FIG. 36.

The configuration of FIG. 33 is a comparative configuration in comparison with the camera CAM1—lighting mechanism layout (see FIG. 14) used in the first embodiment. More specifically, the ring lighting unit RL1 is omitted from the configuration shown in FIG. 16 and instead there are used two coaxial spot lighting units (second light sources) DSL2 and DSL3 which emit parallel light (second irradiation light) to a main surface of a chip 1C at a low angle (the angle θ relative to the chip main surface is about 10° to 60°, preferably 20° to)40°. The two coaxial spot lighting units DSL2 and DSL3 are disposed so as to sandwich the chip 1C in plan. The configuration shown in FIG. 34 is a modification in which the two coaxial spot lighting units DSL2 and DSL3 in the configuration shown in FIG. 33 are replaced with two surface-emitting lighting units (second light source) SSL2 and SSL3. Irradiation light emitted from the two surface-emitting lighting units SSL2 and SSL3 is passed through the diffusing plates KB2 and KB3 and thereby becomes diffused light (second irradiation light) with reduced unevenness in irradiation, which diffused light is radiated to the main surface of the chip 1C at a low angle. Like the two coaxial spot lighting units DSL2 and DSL3, the two surface-emitting lighting units SSL2 and SSL3 are also disposed so as to sandwich the chip 1C in plan. In the configuration shown in FIG. 33 and that shown in FIG. 34, the coaxial spot lighting unit DSL1 can be turned ON and OFF as necessary and it is not always necessary to turn them ON when photographing the main surface of the chip 1C.

Also in the configuration shown in FIG. 36, like the configurations shown in FIGS. 33 and 34, the coaxial spot lighting unit DSL1 can be turned ON and OFF as necessary and it is not always necessary to turn them ON when photographing the main surface of the chip 1C. In the configuration shown in FIG. 36, irradiation light emitted from the ring lighting unit RL1 mounted around an end portion of the lens barrel KT1 opposed to the chip 1C is incident on the chip at a high incidence angle close to that (about 90°) of parallel light from the coaxial spot lighting unit DSL1 on the chip. Therefore, when the chip 1C is warped, irradiation light reflected in an area relatively close to the outer periphery of the chip 1C is not incident on the interior of the lens barrel KT1, so in an image of the chip 1C obtained by the camera CAM1 there is a fear that the area relatively close to the outer periphery of the chip may become dark, resulting in the image being unclear (see FIG. 37).

On the other hand, in the configurations according to this second embodiment shown in FIGS. 33 and 34, the two coaxial spot lighting units DSL2 and DSL3 or the two surface-emitting lighting units SSL2 and SSL3 are disposed at a low angle so as to sandwich the chip 1C in plan. Consequently, irradiation light emitted from the coaxial spot lighting units DSL2 and DSL3 or from the surface-emitting lighting units SSL2 and SSL3 are incident on the chip 1C at a low angle. Accordingly, even when the chip 1C is warped, irradiation light reflected in an area relatively close to the outer periphery of the chip 1C is incident on the interior of the lens barrel KT1. As a result, the image of the chip 1C obtained by the camera CAM1 becomes bright and clear even in the area relatively close to the outer periphery of the chip although the unevenness in illuminance in case of obtaining the chip image in accordance with the configuration of FIG. 33 and that in case of obtaining the chip image in accordance with the configuration of FIG. 34 may be different from each other. According to an experiment conducted by the present inventors, when an image of the chip 1C was obtained using either the configuration of FIG. 33 or that of FIG. 34 according to this second embodiment, a clear image could be obtained even in case of the thickness of the chip 1C being as small as about 20 to 70 μm.

Though not shown, even when the ring lighting unit RL1 is omitted in the configuration of FIG. 14 in the first embodiment and instead there are used the two coaxial spot lighting units DSL2 and DSL3 shown in FIG. 33 or the two surface-emitting light units SSL2 and SSL3 shown in FIG. 34, it is possible to obtain the same effect as that obtained by the configurations shown in FIGS. 33 and 34.

Third Embodiment

Next, a third embodiment of the present invention will be described below.

According to this third embodiment, in connection with the die bonding process described above also in the first and second embodiments, there is provided a method of radiating image photographing light to a chip so as to make features of the chip as conspicuous as possible, the chip 1C having few features of patterns such as electrode pads and surface protecting film both formed on a main surface of the chip.

Figure 38:
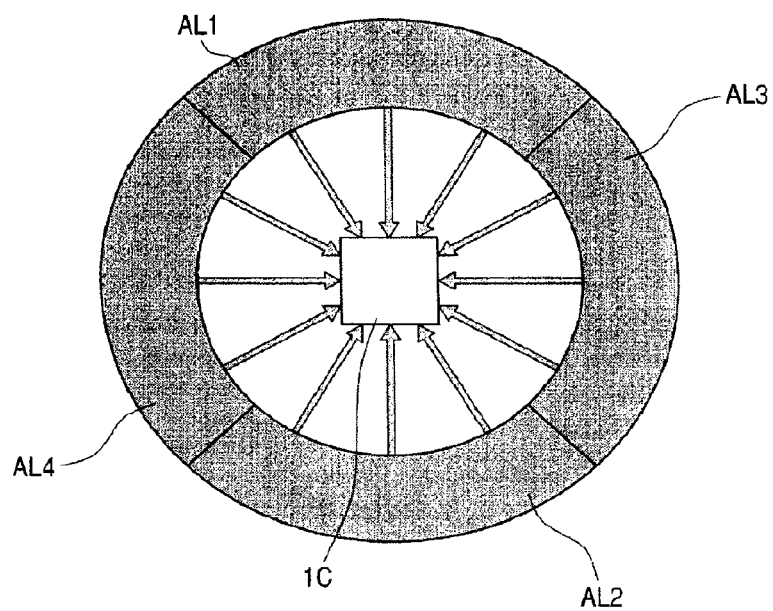
FIG. 38 is a plan view showing a layout of a lighting mechanism used in a die bonding process in manufacturing a semiconductor device according to a third embodiment of the present invention.
Figure 39:
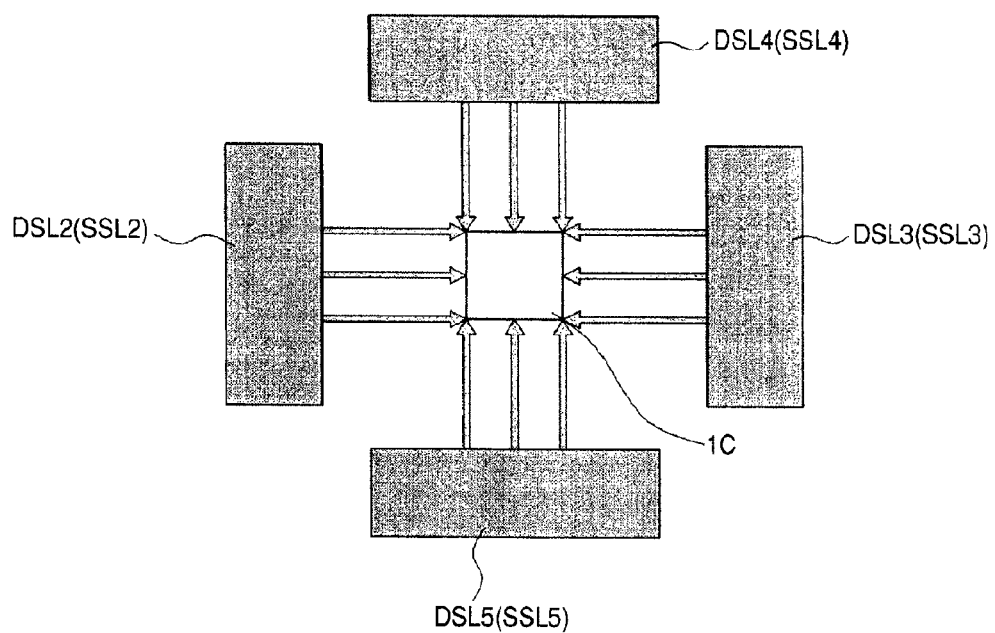
FIG. 39 is a plan view showing a layout of the lighting mechanism used in the die bonding process in the manufacture of the semiconductor device according to the third embodiment.

FIG. 38 is a plan view showing an example of a lighting mechanism in a third embodiment of the present invention. In this third embodiment, as shown in FIG. 38, the ring lighting unit RL1 included in the lighting mechanism (see FIG. 16) shown as a comparative one in the first embodiment is divided into arcuate lighting units (second light sources) AL1 to A14 while leaving its outline intact in such a manner that each of the arcuate lighting units AL1 to AL4 confronts in any of the four sides of the chip 1C in plan. The arcuate lighting units AL1 to AL4 can be turned ON and OFF each independently. Most of the contours of the patterns such as electrode pads and surface protecting film formed on the main surface of the chip 1C are perpendicular or parallel to the four sides of the chip 1C, so by disposing the arcuate lighting units AL1 to AL4 so as to each confront any of the four sides of the chip 1C in plan and by lighting them selectively to radiate light to the chip main surface, it becomes possible to make features of those patterns conspicuous. Instead of using the arcuate lighting units AL1 to AL4 there may be adopted such a configuration as shown in FIG. 39. More specifically, in the configuration of FIG. 33 or FIG. 34 in the second embodiment, coaxial spot lighting units (second light sources) DSL4 and DSL5 or surface-emitting lighting units (second light sources) SSL4 and SSL5 may be disposed in accordance with the same layout rule as that of the coaxial spot lighting units DSL2 and DSL3 or the surface-emitting lighting units SSL2 and SSL3. In this case, like the arcuate lighting units AL1 to AL4, the coaxial spot lighting units DSL2 to DSL5 or the surface-emitting lighting units SSL2 to SSL5 each confront any of the four sides of the chip 1C in plan. As is the case with the arcuate lighting units AL1 to AL4, they are turned ON selectively to radiate light to the main surface of the chip 1C, whereby features of the patterns such as electrode pads and surface protecting film formed on the chip main surface can be made conspicuous.

Figure 40:
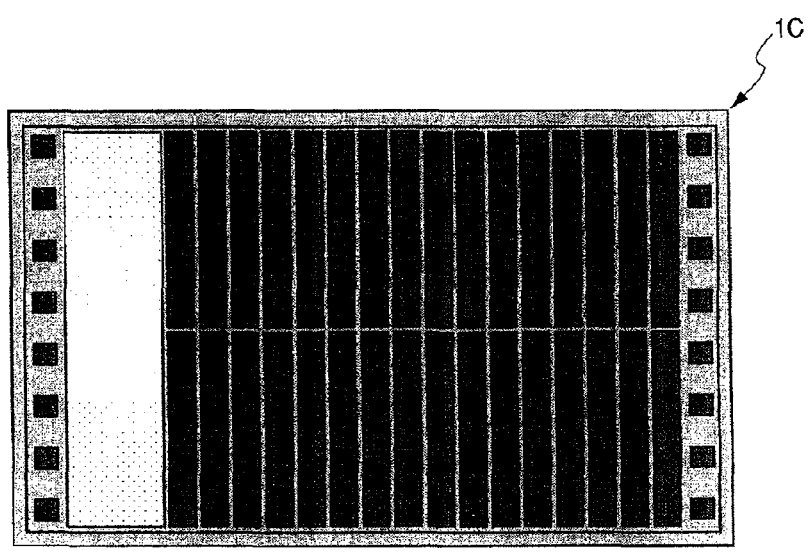
FIG. 40 is an explanatory diagram showing an image of a chip main surface obtained using the lighting mechanism shown in FIGS. 38 and 39.
Figure 41:
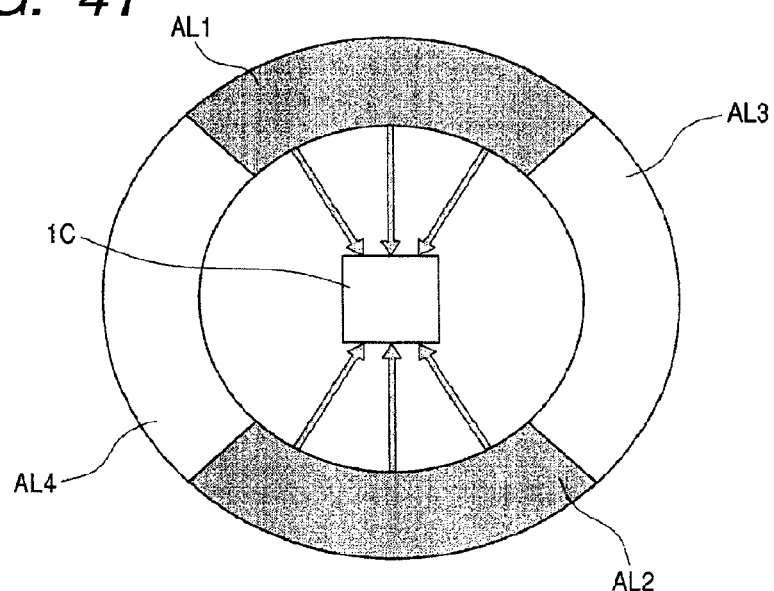
FIG. 41 is a plan view showing a layout of the lighting mechanism used in the die bonding process in the manufacture of the semiconductor device according to the third embodiment.
Figure 42:
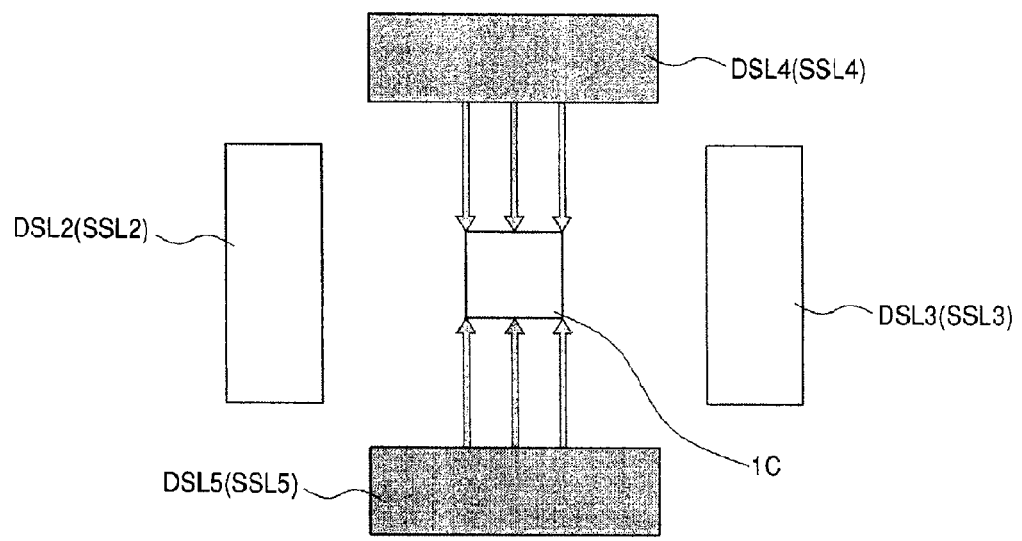
FIG. 42 is a plan view showing a layout of the lighting mechanism used in the die bonding process in the manufacture of the semiconductor device according to the third embodiment.
Figure 43:
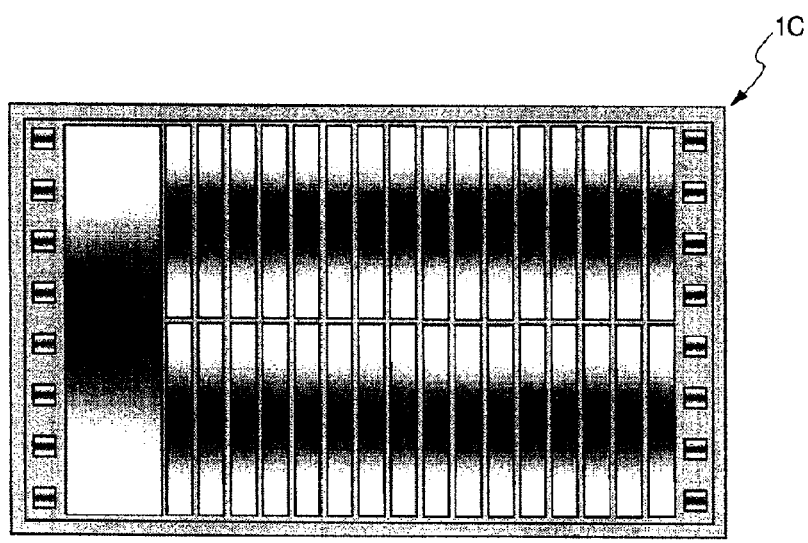
FIG. 43 is an explanatory diagram showing an image of a chip main surface obtained using the lighting mechanism shown in FIGS. 41 and 42.
Figure 44:
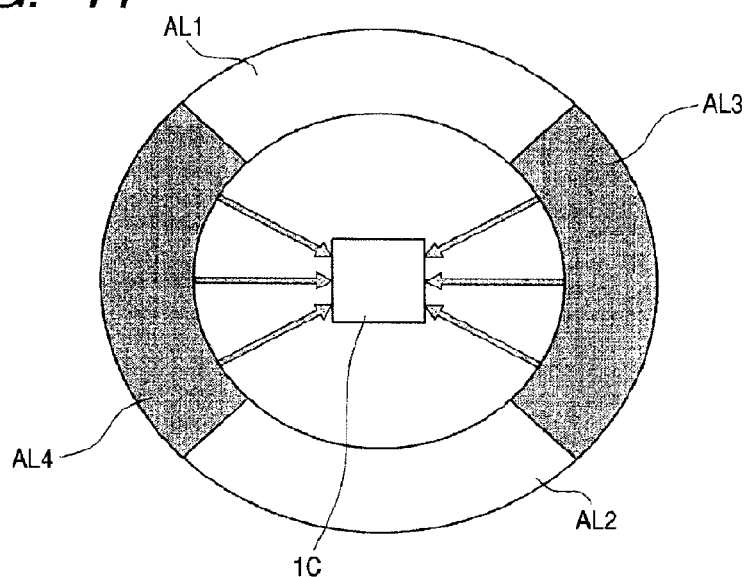
FIG. 44 is a plan view showing a layout of the lighting mechanism used in the die bonding process in the manufacture of the semiconductor device according to the third embodiment.
Figure 45:
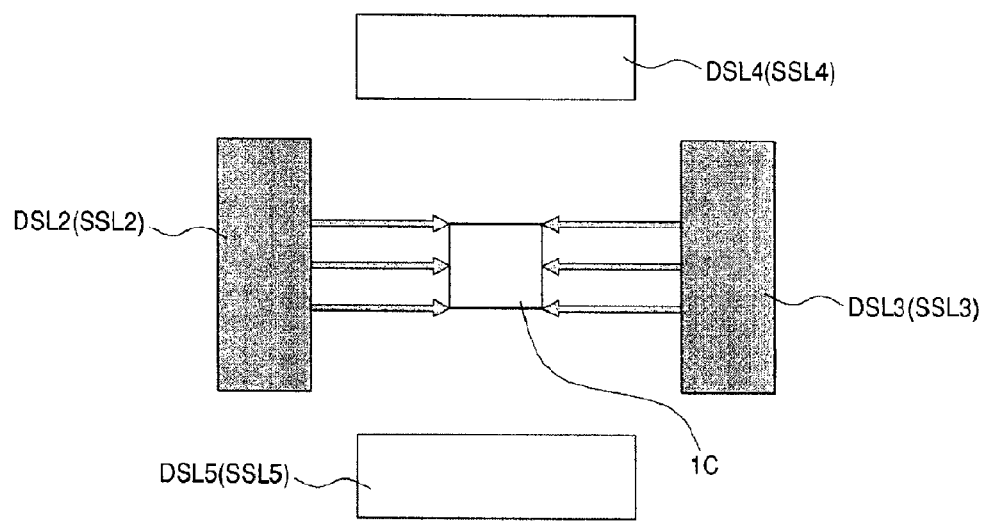
FIG. 45 is a plan view showing a layout of the lighting mechanism used in the die bonding process in the manufacture of the semiconductor device according to the third embodiment.
Figure 46:
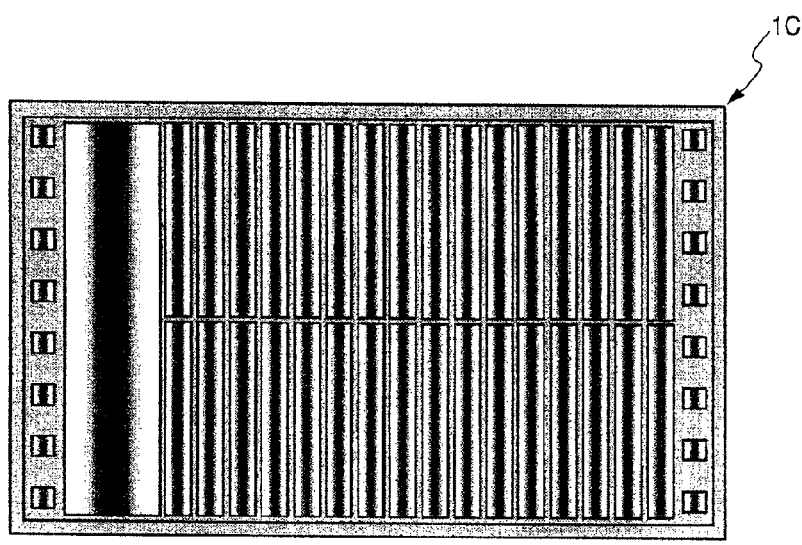
FIG. 46 is an explanatory diagram showing an image of a chip main surface obtained using the lighting mechanism shown in FIGS. 44 and 45.

FIGS. 38 and 39 show a state in which the arcuate lighting units AL1 to AL4 and the coaxial spot lighting units DSL2 to DSL5 or the surface-emitting lighting units SSL2 to SSL5 are all turned ON, which ON condition is indicated by coloring the drawings. FIG. 40 shows an example of an image of the main surface of the chip 1C obtained in a lit condition of all the arcuate lighting units AL1 to AL4 and the coaxial spot lighting units DSL2 to DSL5 or the surface-emitting lighting units SSL2 to SSL5. FIG. 41 shows a state in which only the arcuate lighting units AL1 and AL2 opposite to each other with respect to the chip 1C in plan are ON, while FIG. 42 shows a state in which only the coaxial spot lighting units DSL4 and DSL5 or the surface-emitting lighting units SSL4 and SSL5 opposite to each other with respect to the chip 1C in plan are ON, and FIG. 43 shows an example of an image of the main surface of the chip 1C obtained in the lit condition of FIGS. 41 and 42. Further, FIG. 44 shows a state in which only the arcuate lighting units AL3 and AL4 opposite to each other with respect to the chip 1C in plan are ON, while FIG. 45 shows a state in which only the coaxial spot lighting units DSL2 and DSL3 or the surface-emitting lighting units SSL2 and SSL3 opposite to each other with respect to the chip 1C in plan are ON, and FIG. 46 shows an example of an image of the main surface of the chip 1C obtained in the lit condition of FIGS. 44 and 45.

In this third embodiment, as described above, the arcuate lighting units AL1 to AL4 and the coaxial spot lighting units DSL2 to DSL5 or the surface-emitting lighting units SSL2 to SSL5 are turned ON selectively and an image which is most conspicuous in pattern features on the main surface of the chip 1C is adopted as an image of the main surface of the chip 1C to be picked up. By so doing, even when there are few pattern features on the chip main surface, it is possible to make features of the chip main surface conspicuous and extract them. As a result, it is possible to greatly diminish the case of advancing to the error output of step P7 (see FIG. 9) described in the first embodiment. That is, it becomes possible to greatly improve the productivity of the semiconductor device in this third embodiment.

Fourth Embodiment

A fourth embodiment of the present invention will be described below.

The calculation of a positional deviation quantity from the pickup position of the chip 1C to be picked up in the die bonding process (step P4 (see FIG. 9)) will be described below in more detail.

Figure 47:
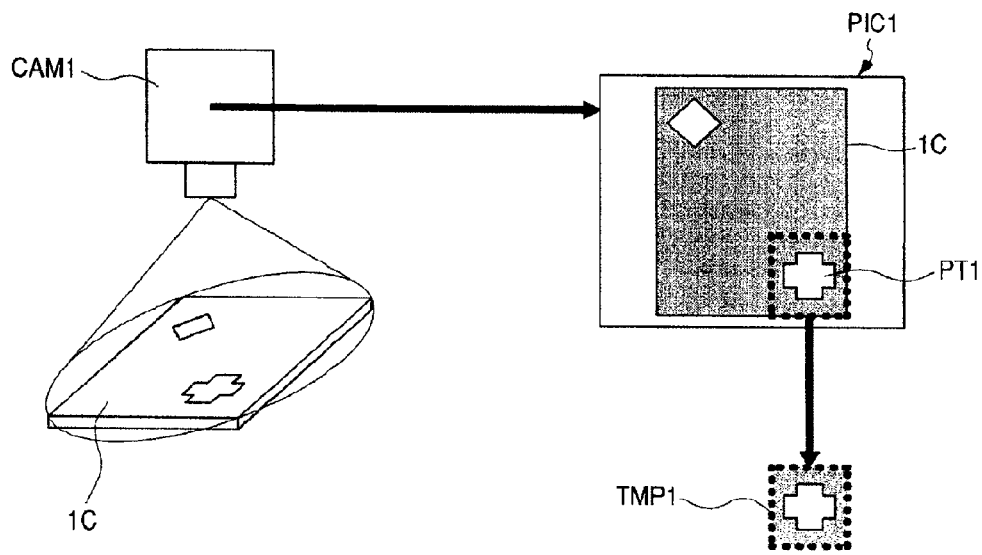
FIG. 47 is an explanatory diagram showing a basic image acquiring method in a die bonding process in manufacturing a semiconductor device according to a fourth embodiment of the present invention.

As shown in FIG. 47, an image (ninth image) PIC1 of a main surface of a chip 1C as a reference chip is acquired beforehand using a lighting mechanism and a camera CAM1 (see also FIG. 14 for example) which are used in photographing a main surface of a chip 1C to be picked up. At this time, the position where the reference chip 1C is disposed is already known. Next, within the acquired image PIC1, a portion including a characteristic pattern PT1 (a portion not encountering any other similar shape or pattern within the same image) is cut out as a template TMP1 and coordinates of the template TMP1 within the image PIC1 are recorded. In locating the to-be-picked-up chip 1C to the pickup position, the template TMP1 is used in calculating a positional deviation quantity from the pickup position and is therefore selected from the positioning area within the main surface of the chip 1C.

Figure 48:
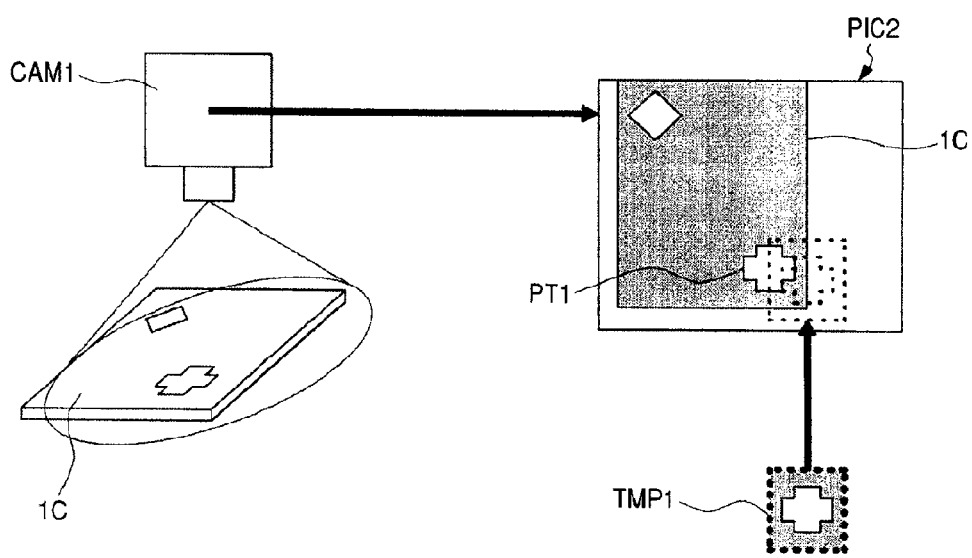
FIG. 48 is an explanatory diagram showing a method for comparison between a basic image and an image of a chip to be picked up in the die bonding process in the manufacture of the semiconductor device according to the fourth embodiment.

As shown in FIG. 48, when photographing the main surface of the to-be-picked-up chip 1C with the camera CAM1 and calculating a positional deviation quantity of the to-be-picked-up chip 1C from the pickup position on the basis of the acquired image (step P4 (see FIG. 9)), first the main surface of the to-be-picked-up chip 1C is photographed by the camera CAM1 to acquire an image (first image) PIC2, as described also in the first embodiment. Next, a portion where the same pattern PT1 as the pattern PT1 of the template TMP1 is found out from the image PIC2, then coordinates in which the pattern PT1 thus found out is disposed within the image PIC2 and the foregoing coordinates of the template TMP1 are subjected to a comparative calculation, thereby calculating a positional deviation quantity of the to-be-picked-up chip 1C from the pickup position. For example, a normalized correlation expression may be used for the comparative calculation.

Figure 49:
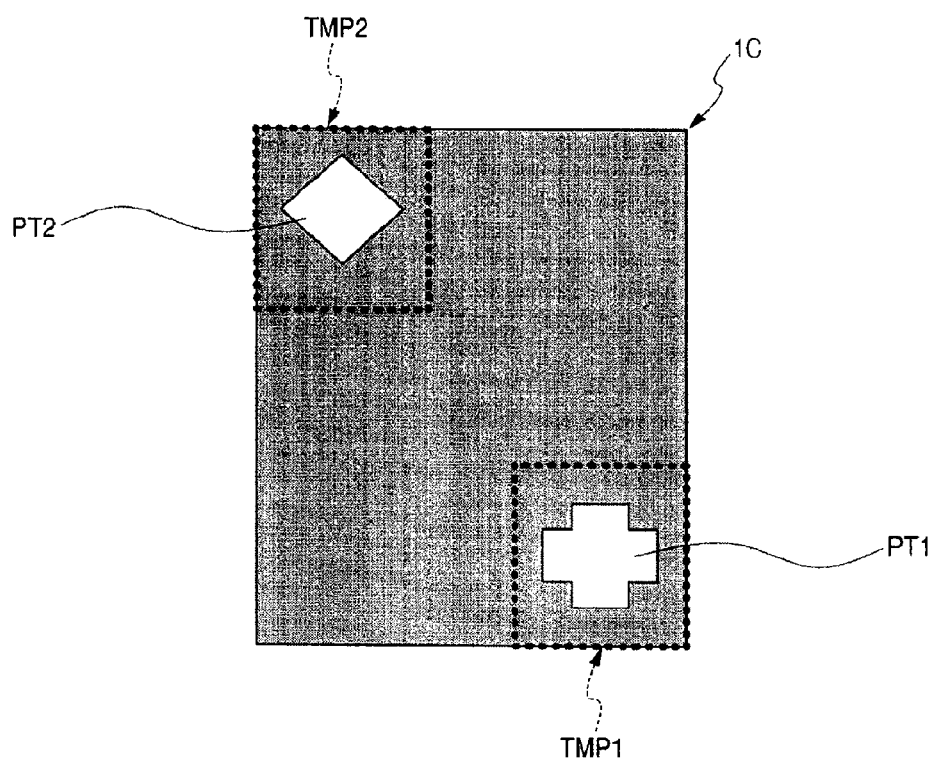
FIG. 49 is an explanatory diagram showing another method for comparison between a basic image and an image of a chip to be picked up in the die bonding process in the manufacture of the semiconductor device according to the fourth embodiment.

There also may be adopted a method wherein, as shown in FIG. 49, a portion including a characteristic pattern PT2 other than the characteristic pattern PT1 as the template TMP1 is cut out from the image PIC1 as a template TMP1 and coordinates of the template TMP1 within the image PIC1 are recorded. According to this method it is possible to prepare two templates TMP1 and TMP2. Using these two templates TMP1 and TMP2, positional deviation quantities of the patterns PT1 and PT2 are determined from the image PIC2 which is an image of the main surface of the chip 1C to be picked up, whereby it becomes possible to calculate not only a positional deviation quantity (a positional deviation quantity in a direction along one side of the chip 1C and a positional deviation quantity in a direction along another side perpendicular to the one side) of the to-be-picked-up chip 1C from the pickup position but also an inclination quantity of the chip 1C in a direction along the chip IC main surface.

In connection with the die bonding process described in the first embodiment, a more detailed description will be given about the step (step P6 (see FIG. 9)) of confirming the absence of the to-be-picked-up chip 1C on the dicing tape 4. In this fourth embodiment the step P6 is carried out using the lighting mechanism (see FIGS. 33 and 34) which emits light to the main surface of the chip 1C at a low angle as described in the second embodiment. As described also in the first embodiment, the dicing tape 4 is formed using a transparent or translucent material, so when the chip 1C to be picked up is not present, the emitted light passes through the dicing tape 4. Consequently, it becomes possible to catch what is present under the dicing tape 4 within the image PIC2. Therefore, by recognizing what is present (the chucking unit 102 (see FIG. 10)) under the dicing tape 4 within the image PIC2, it is possible to determine that the chip 1C to be picked up is not present.

Figure 50:
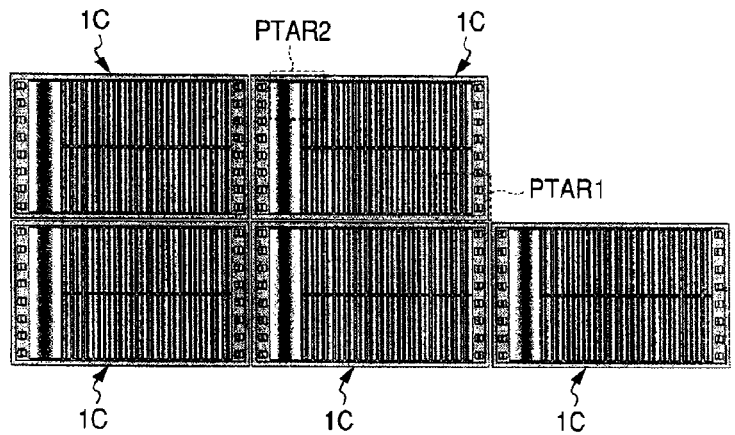
FIG. 50 is an explanatory diagram of an image used in determining whether a chip to be picked up is present or not in the die bonding process in the manufacture of the semiconductor device according to the fourth embodiment.

For example, if the chip 1C to be picked up is present, then within the image PIC2 obtained by the camera CAM1, the patterns PT1 and PT2 are recognized in areas PTAR1 and PTAR2 respectively and a matching rate with the patterns PT1 and PT2 in the two pre-acquired templates TMP1 and TMP2 is assumed to be about 90% (see FIG. 50). If the pickup of the chip 1C is to be done when the matching rate is larger than a predetermined rate (first rate), for example, 50%, then in order for the matching rate to be about 90% it is possible to recognize the presence and position of the chip 1C to be picked up, so that a positional deviation quantity from the pickup position of the chip 1C to be picked up can be calculated in step P4 or P5 described in the first embodiment and the processing flow does not advance to step P6.

When the matching rate is not larger than 50%, a distinction is made between the case where the chucking unit 102 is not recognized within the areas PTAR1 and PTAR" (see FIG. 51) and the case where it is recognized (see FIG. 52), and in the latter case it is determined that the chip 1C to be picked up is not present. When the chucking unit 102 is not recognized within the areas PTAR1 and PTAR2, this means that ink or the like indicating a foreign matter or a defective chip appears in at least one of the areas PTAR1 and PTAR2 and the matching rate is not larger than 50%. In this case, an error signal is outputted and the die bonding process is stopped, as described in connection with step P7 (see FIG. 9) in the first embodiment.

Figure 53:
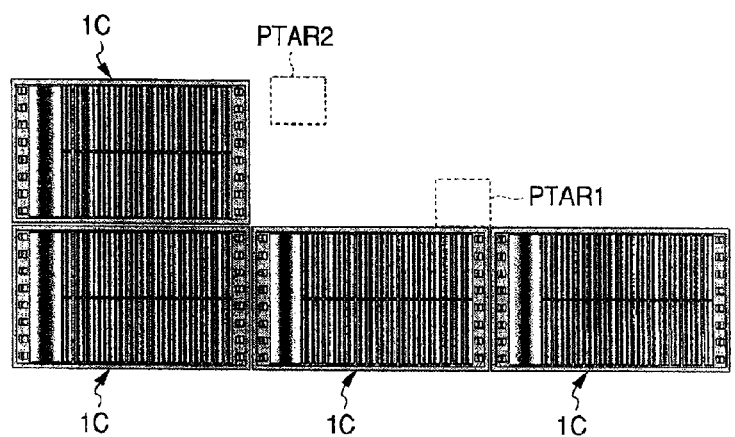
FIG. 53 is an explanatory diagram of an image used in determining whether a chip to be picked up is present or not in the die bonding process which the present inventors have studied in comparison with the fourth embodiment.

According to an experiment conducted by the present inventors, when the lighting mechanism (see FIG. 16) described as a control in the first embodiment was used, irradiation light did not pass through the dicing tape 4, and even in the absence of the chip 1C to be picked up, the chucking unit 102 underlying the dicing tape 4 could not be recognized in the areas PTAR1 and PTAR2 within the image PIC2 (see FIG. 53). That is, since the chucking unit 102 which underlies the dicing tape 4 on the chip 1C to be picked up cannot be recognized even when the matching rate is not larger than 50%, it becomes impossible to determine the absence of the chip 1C to be picked up. Consequently, even when the chip 1C to be picked up is not present, it becomes uncertain whether the chip 1C to be picked up is present or not, and an error signal is outputted in step P7 described in the first embodiment to stop the die bonding process.

Figure 51:
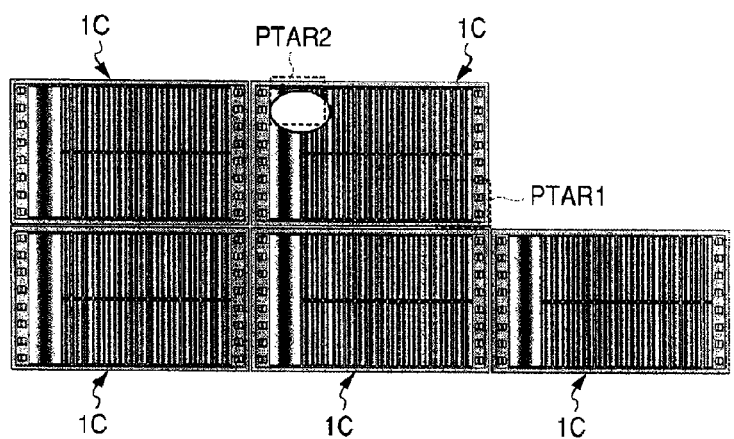
FIG. 51 is an explanatory diagram of an image used in determining whether a chip to be picked up is present or not in the die bonding process in the manufacture of the semiconductor device according to fourth embodiment.
Figure 52:
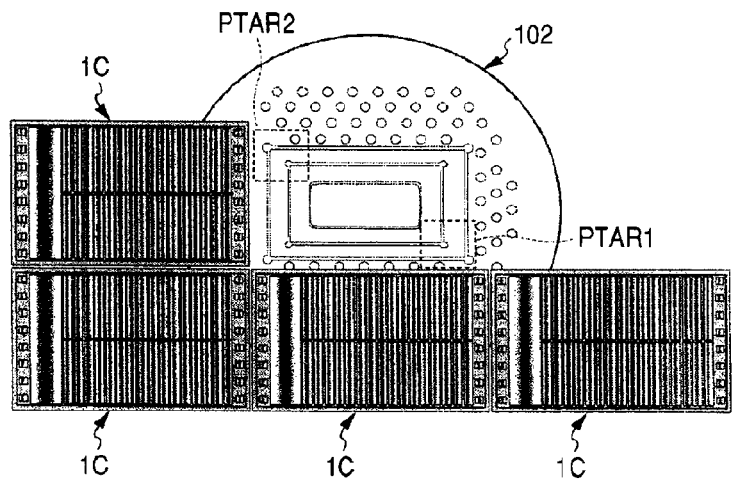
FIG. 52 is an explanatory diagram of an image used in determining whether a chip to be picked up is present or not in the die bonding process in the manufacture of the semiconductor device according to the fourth embodiment.

On the other hand, in this fourth embodiment, as described with reference to FIGS. 50 to 52, by recognizing the chucking unit 102 in the image PIC2 it is possible to surely determine the absence of the chip 1C to be picked up. Consequently, when the chip 1C to be picked up is not present, the determination to the effect of the presence or absence of the chip 1C to be picked up being uncertain can be presented positively. Therefore, it is possible to prevent the processing flow from advancing to step P7 and hence possible to prevent the output of an error signal and stop of the die bonding process. As a result, it becomes possible to improve the semiconductor device manufacturing yield in this fourth embodiment.

Fifth Embodiment

A fifth embodiment of the present invention will be described below.

As described in the fourth embodiment, when the matching rate between the patterns PT1, PT2 in the two templates TMP1, TMP2 formed from an image of the main surface of the chip 1C obtained in advance and the patterns PT1, PT2 of the image PIC2 of the main surface of the to-be-picked-up chip 1C obtained by the camera CAM1 is near the threshold value (about 50%) and it is difficult to determine the absence of the chip 1C to be picked up, this fifth embodiment takes the following measure.

When the matching rate is near the threshold value, one conceivable means is to increase the shutter speed of the camera CAM1 to make the image PIC2 clearer. However, in the lighting mechanism (see FIGS. 33 and 34) used in the second embodiment and also used in the fourth embodiment, there is adopted a coaxial spot lighting unit or a surface-emitting lighting unit using LED as a light source whose quantity of light is insufficient for increasing the shutter speed of the camera CAM1. Therefore, the lighting mechanism used in the second embodiment may be unable of improve the shutter speed of the camera CAM1.

Figure 54:
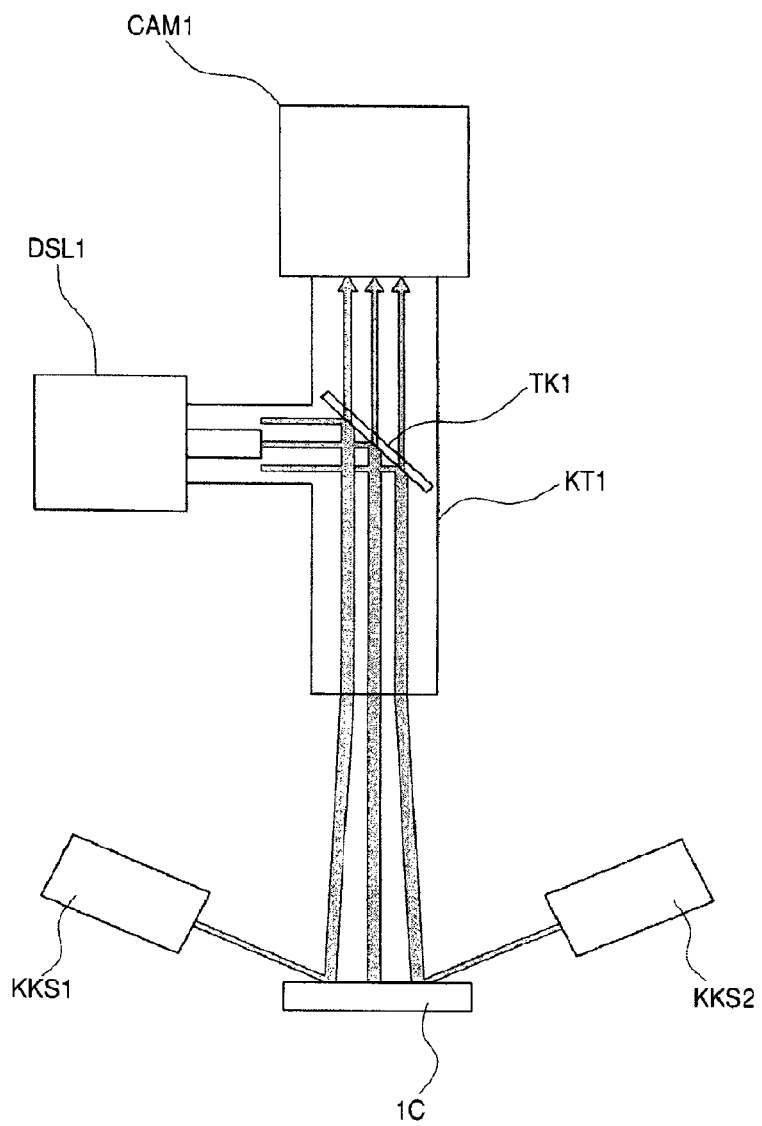
FIG. 54 is an explanatory diagram showing a layout of a camera and a lighting mechanism used in a die bonding process in manufacturing a semiconductor device according to a fifth embodiment of the present invention.
Figure 55:
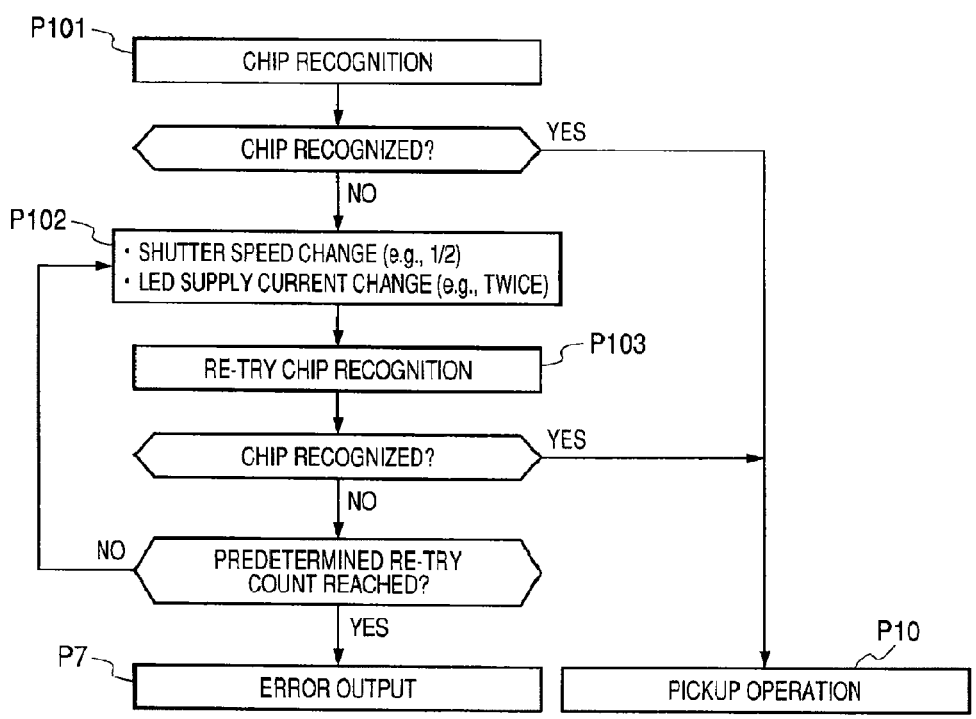
FIG. 55 is a flow chart explaining the details of a chip image acquiring step in the die bonding process in the manufacture of the semiconductor device according to the fifth embodiment.

FIG. 54 is an explanatory diagram showing the layout of a camera CAM1 and a lighting mechanism both used in a die bonding process in this fifth embodiment, the lighting mechanism emitting image photographing light to a chip 1C to be picked up. In the lighting mechanism used in this fifth embodiment, as shown in FIG. 54, the two coaxial spot lighting units DSL2 and DSL3 or the two surface-emitting lighting units SSL2 and SSL3 in the lighting mechanism (see FIGS. 33 and 34) used the second embodiment and also used in the fourth embodiment are replaced with two high luminance lighting units KKS1 and KKS2. As the high luminance lighting units KKS1 and KKS2 there may be used, for example, halogen lights higher in luminance than the LED light source. A method for photographing an image PIC2 of the main surface of the chip 1C to be picked up with use of such a lighting unit in this fifth embodiment will be described in detail below in accordance with a flow chart of FIG. 55.

First, recognition of the chip 1C to be picked up is performed by checking the foregoing matching rate (step P101). When the matching rate is obviously larger than the threshold value (when the chip 1C to be picked up could be recognized), it is possible to recognize the presence and position of the chip 1C to be picked up and hence a positional deviation quantity from the pickup position of the chip 1C to be picked up can be calculated in step P4 (see FIG. 9) or step P5 (see FIG. 9) described in the first embodiment. After the positional deviation quantity from the pickup position of the chip 1C to be picked up has been calculated, the processing flow can advance to subsequent steps including a pickup operation (step P10 (see also FIG. 9)).

On the other hand, when the matching rate is near the threshold value, the main surface of the chip 1C to be picked up is again photographed (picked up) under a changed shutter speed condition of the camera CAM1 (e.g., a shutter speed of about one half) to again acquire an image PIC2 (steps P102, P103). At this time, when the quantity of light to be radiated to the main surface of the to-be-picked-up chip 1C is to be changed with the change in shutter speed of the camera CAM1, the amount of an electric current fed to the coaxial spot lighting unit DSL1 using LED as a light source which permits switching of the light quantity in a shorter time than in the use of a halogen light is changed (e.g., about twice) to change the quantity of light emitted from the coaxial spot lighting unit DSL1. As a result, it becomes possible to effect switching of the quantity of light at high speed and hence possible to effect re-photographing (retrial of photographing) of the main surface of the chip 1C in a shorter time, thus permitting the image PIC2 to be obtained again in an efficient manner. When the matching rate is obviously larger than the threshold value, it is possible to recognize the presence and position of the chip 1C to be picked up and hence a positional deviation quantity from the pickup position of the chip 1C to be picked up can be calculated in step P4 or P5 described in the first embodiment. After the positional deviation from the pickup position of the chip 1C to be picked up has been calculated, the processing flow can advance to subsequent steps including a pickup operation (step P10).

On the other hand, when the matching rate is near the threshold value also in step P103, a check is made to see if the number of times the steps P102 and P103 were carried out (the number of times of retrial) has reached a predetermined number of times (for example, three times) or not. If the answer is negative, the steps P102 and P103 are again carried out under changed conditions of the shutter speed of the camera CAM1 and of the amount of light emitted from the coaxial spot lighting unit DSL1. At this time, the conditions may comprise a decreased (prolonged) shutter speed of the camera CAM1 and a decreased amount of light emitted from the coaxial spot lighting unit DSL1. Also in this case, retrial of photographing of the main surface of the chip 1C can be done in a shorter time because the switching of the quantity of light can be done at high speed. When the number of time of retrial has reached the predetermined number of times, an error signal is outputted to stop the die bonding process (step P7

(see also FIG. 9)). The number of times of retrial can be set appropriately according to for example a demand for improvement of productivity.

According to this fifth embodiment it is possible to effect retrial of photographing of the main surface of the chip 1C effectively when the matching rate is near the threshold value. Consequently, when the matching rate obviously exceeded the threshold value as a result of retrial of photographing, it becomes possible for the processing flow to advance to subsequent steps including a pickup operation (step P10), thus making it possible to diminish the inconvenience that an error signal is outputted to stop the die bonding step (step P7). That is, the semiconductor device manufacturing productivity in this fifth embodiment can be greatly improved.

Though not shown, in the configuration of FIG. 14 adopted in the first embodiment, the ring lighting unit RL1 may be omitted and the two high luminance lighting units KKS1 and KKS2 shown in FIG. 54 may be disposed. Even in this case it is possible to obtain the same effect as in the configuration of FIG. 54.

Sixth Embodiment

A sixth embodiment of the present invention will be described below.

Figure 56:
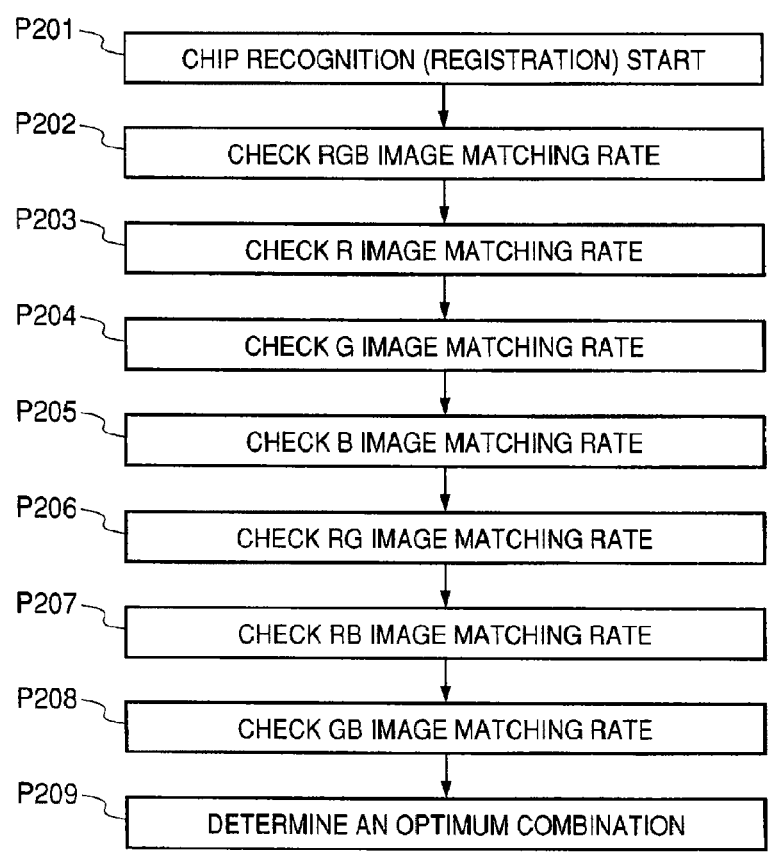
FIG. 56 is a flow chart explaining the details of a chip image acquiring step in a die bonding process in manufacturing a semiconductor device according to a sixth embodiment of the present invention.

In this sixth embodiment, the camera CAM1 described also in the first to sixth embodiments receives only light of a specific color and there is obtained an image PIC2 of the main surface of the chip 1C to be picked up. More specifically, in this sixth embodiment, the camera CAM1 is provided with color CCDs (Charge Coupled Devices) as light receiving elements, which receive at least one of R (red), G (green) and B (blue) light selectively. A method for forming an image PIC2 with use of such color CCDs in this sixth embodiment will be described in detail below in accordance with the flow chart of FIG. 56.

When the processing for recognizing the chip 1C to be picked up (registration of the image PIC2) is started, first the color CCDs are set so as to receive all of R, G and B light for example and an image (RGB image (second image)) of the main surface of the chip 1C to be picked up is obtained, then the matching rate of the RGB image is measured (step P202).

Next, the color CCDs are set so as to receive R light and an image (R image (third image)) of the main surface of the chip 1C to be picked up is obtained, then the matching rate of the R image is measured (step P203).

Then, the color CCDs are set so as to receive G light and an image (G image (fourth image)) of the main surface of the chip 1C to be picked up is obtained, then the matching rate of this image is measured (step 204).

Next, the color CCDs are set so as to receive B light and an image (B image (fifth image) of the main surface of the chip 1C to be picked up is obtained, then the matching rate of the B image is obtained (step P205).

Then, the color CCDs are set so as to receive R and G light and an image (RG image (sixth image) of the main surface of the chip 1C to be picked up is obtained, then the matching rate of the RG image is measured (step P206).

Next, the color CCDs are set so as to receive R and B light and an image (RB image (seventh image) of the main surface of the chip 1C to be picked up is obtained, then the matching rate of the RB image is measured (step P207).

Then, the color CCDs are set so as to receive G and B light and an image (GB image (eighth image)) of the main surface of the chip 1C to be picked up is obtained, then the matching rate of the GB image is measured (step P208).

Next, among the RGB image, R image, G image, B image, RG image, RB image and GB image thus obtained, one having the highest matching rate is made an image PIC2 of the main surface of the to-be-picked-up chip 1C automatically (step 209).

Thus, in this sixth embodiment, various images are formed using R, G and b light each alone or in combination and one having the highest matching rate is made an image PIC2 of the main surface of the chip 1C to be picked up, whereby it is possible to obtain an optimum image PIC2 of the chip main surface automatically according to the material and color of the chip main surface. That is, since it is possible to automatically select a light receiving condition which gives the highest matching rate, it becomes possible to diminish the inconvenience that an error signal is outputted to stop the die bonding process (step P7 (see FIGS. 9 and 55)).

In this sixth embodiment, moreover, since various images are formed using R, G and B light each alone or in combination and one having the highest matching rate is selected as an image PIC2 of the main surface of the chip 1C to be picked up, the matching rate can be improved insofar as possible even in the case where there are few features of patterns on the main surface of the chip 1C, for example even in the case where a memory cell is formed in the chip 1C. Consequently, the inconvenience that an error signal is outputted to stop the die bonding process can be diminished, thus making it possible to greatly improve the semiconductor device manufacturing productivity in this sixth embodiment.

Although the present invention has been described above concretely on the basis of embodiments thereof, it goes without saying that the present invention is not limited to the above embodiments, but that various changes may be made within the scope not departing from the gist of the invention.

For example, although at the time of picking up a chip held by the dicing tape in the above embodiment the chucking unit is sucked to the dicing tape and the chip to be picked up is thrust up from the dicing tape side by means of a multi-stage type pusher (stick-up jig) provided in the chucking unit, the multi-stage type pusher may be substituted by a stick-up jig comprising plural stick-up pins or a stick-up jig having an oscillator for the application of ultrasonic waves.

The fabrication method of the semiconductor device of the present invention is applicable widely to a semiconductor device manufacturing process involving the steps of dicing a semiconductor wafer with a pressure-sensitive adhesive tape affixed thereto into plural semiconductor chips, picking up each of the semiconductor chips from the pressure-sensitive adhesive tape and mounting the picked-up chip onto a mounting area of a wiring substrate or the like.

What is claimed is:

1. A fabrication method of a semiconductor device, comprising the steps of:
   (a) providing a semiconductor wafer having a main surface and a back surface, the main surface being partitioned into a plurality of chip areas by dividing areas, with an integrated circuit being formed in each of the chip areas, the back surface having a pressure-sensitive adhesive tape affixed thereto;
   (b) cutting the semiconductor wafer along the dividing areas into a plurality of semiconductor chips and holding the semiconductor chips with the pressure-sensitive adhesive tape;
   (c) radiating first irradiation light emitted from a first light source, from above, to an upper surface of a first semiconductor chip to be peeled off from the pressure-sensitive adhesive tape out of the semiconductor chips held with the pressure-sensitive adhesive tape, radiating second irradiation light to the upper surface of the first semiconductor chip from second light sources disposed so as to surround the first semiconductor chip therebetween in plan view, receiving first reflected light from the upper surface of the semiconductor chip by an image pickup device, and acquiring a first image of the upper surface of the first semiconductor chip;

(d) based on the first image acquired in step (c), determining whether the first semiconductor chip is present or not and whether the first semiconductor chip is good or bad, and if, based on the first image, the first semiconductor chip is determined to be present as a good chip, chucking and holding the upper surface of the first semiconductor chip by a chucking collet and thereby peeling off the first semiconductor chip from the pressure-sensitive adhesive tape; and (e) after step (d), die-bonding a lower surface of the first semiconductor chip to a chip mounting area while chucking and holding the upper surface of the first semiconductor chip by the chucking collet, wherein the first semiconductor chip has a substantially rectangular shape, a first side, a second side opposite the first side, a third side and a fourth side, which intersect the first and second sides in plan view, wherein said second light sources include a first unit, a second unit opposite the first unit, a third unit, and a fourth unit opposite the third unit in plan view, and wherein the first side confronts the first unit, second side confronts the second unit, the third side confronts the third unit, and the fourth side confronts the fourth unit.

2. The fabrication method according to claim 1, wherein the first unit, the second unit, the third unit and the fourth unit are arcuate lighting units.

3. The fabrication method according to claim 2, wherein said arcuate lighting units are turned ON and OFF independently.

4. The fabrication method according to claim 1, wherein the first unit, the second unit, the third unit, and the fourth unit are coaxial spot lighting units.

5. The fabrication method according to claim 4, wherein said coaxial spot lighting units are turned ON and OFF independently.

6. The fabrication method according to claim 1, wherein step (d) further comprises the steps of:

(d1) thrusting up the pressure-sensitive adhesive tape by a stick-up jig from a back side opposite the pressure-sensitive adhesive side which holds the semiconductor chips, thereby thrusting up the first semiconductor chip while chucking and holding the upper surface of the first semiconductor chip by the chucking collet and peeling off the first semiconductor chip from the pressure-sensitive adhesive tape; and (d2) comparing the first image obtained in step (c) with a pre-acquired ninth image of the upper surface of the first semiconductor chip as a good chip and determining whether the first semiconductor chip is present or not and whether the first semiconductor chip is good or bad, wherein when the first and ninth images match at a first ratio or a ratio higher than the first ratio in step (d2), it is determined that the first semiconductor chip is present and is a good chip, and when the first and ninth images match at a ratio lower than the first ratio and if the presence of the stick-up jig is recognized within the first image, it is determined that the first semiconductor chip is not present, and steps (d1) and (e) are omitted, and if the presence of the stick-up jig is not recognized within the first image, it is determined that the first semiconductor chip is not recognized, and steps (d1) and (e) are omitted.

7. The fabrication method according to claim 1, wherein the first light source is higher in light quantity switching speed than the second light sources, wherein the second light sources are higher in luminance than the first light source, wherein, in a threshold state in step (d) in which it cannot be determined from the first image whether the first semiconductor chip is present or not and whether the first semiconductor chip is good or bad, a shutter speed of the image pickup device is made short and steps (c) and (d) are carried out under an increased condition of the quantity of light of the first irradiation light emitted from the first light source, and wherein if thereafter the threshold state continues and it cannot be determined whether the first semiconductor chip is present or not and whether the first semiconductor chip is good or not, the shutter speed of the image pickup device is made long and steps (c) and (d) are again carried out under a decreased condition of the quantity of light of the first irradiation light emitted from the first light source.

8. The fabrication method according to claim 7, wherein the first light source is a high response lighting unit including an LED lighting unit, and wherein each of said second light sources is a high luminance lighting unit including a halogen lighting unit.

9. The fabrication method according to claim 8, wherein in the threshold state the shutter speed of the image pickup device is set to one half and step (c) is carried out under a condition in which an electric current supplied to the LED lighting unit as the first light source is set to twice as much.

10. The fabrication method according to claim 1, wherein the image pickup device receives one or more of red, green, and blue colors selectively, and wherein one of second, third, fourth, fifth, sixth, seventh and eighth images which most conspicuously represents a feature of the upper surface of the first semiconductor chip is made the first image automatically, the second image being obtained by receiving the red, green, and blue colors, the third image being obtained by receiving only the red color, the fourth image being obtained by receiving only the green color, the fifth image being obtained by receiving only the blue color, the sixth image being obtained by receiving the red and green colors, the seventh image being obtained by receiving the red and blue colors, and the eighth image being obtained by receiving the green and blue colors.

11. The fabrication method according to claim 1, wherein the integrated circuit is a memory circuit.

12. The fabrication method according to claim 1, wherein the first irradiation light is radiated to the upper surface of the first semiconductor chip through a semi-transparent mirror disposed within a lens barrel, and wherein the first reflected light is incident on the image pickup device through the semitransparent mirror.

13. The fabrication method according to claim 1, wherein the thickness of the first semiconductor chip is not larger than 75 µm.

* * * * *